US006280496B1

(12) United States Patent
Kawai et al.

(10) Patent No.: US 6,280,496 B1
(45) Date of Patent: Aug. 28, 2001

(54) SILICON CARBIDE BASED COMPOSITE MATERIAL AND MANUFACTURING METHOD THEREOF

(75) Inventors: Chihiro Kawai; Shin-ichi Yamagata; Akira Fukui; Yoshinobu Takeda, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/392,093

(22) Filed: Sep. 8, 1999

(30) Foreign Application Priority Data

Sep. 14, 1998 (JP) .................................................. 10-260003

(51) Int. Cl.$^7$ .................................................. C22C 29/02
(52) U.S. Cl. .............................. 75/236; 75/247; 75/249; 419/14; 419/29; 419/30; 419/31; 419/38; 419/48; 501/88; 501/89
(58) Field of Search ............................. 75/236, 247, 249; 919/29, 30, 31, 38, 48, 14; 501/88, 89

(56) References Cited

U.S. PATENT DOCUMENTS 5,561,829 * 10/1996 Sawtell et al. .......................... 419/13
5,770,324 * 6/1998 Holmes et al. ....................... 428/688
5,942,454 * 8/1999 Nakayama et al. ..................... 501/88

\* cited by examiner

Primary Examiner—Ngoclan Mai
(74) Attorney, Agent, or Firm—W. F. Fasse; W. G. Fasse

(57) ABSTRACT

A silicon carbide based composite material includes as a first component, a metal mainly consisting of aluminum or copper, and as a second component, particles mainly consisting of silicon carbide having high purity and few defects. The material is obtained by heating a compact of the raw material powder containing the first and second components at a temperature not lower than the melting point of the metal mainly consisting of aluminum or copper, and by forging and solidifying under pressure. Preferably, the silicon carbide raw material powder is prepared to have high purity by carrying out a preliminary treatment, or the material after forging or a material obtained through a conventional infiltration process is further heated at a temperature lower than the melting point of the first component. In this manner, an improved superior thermal conductivity can be obtained.

30 Claims, 2 Drawing Sheets

SILICON CARBIDE BASED COMPOSITE MATERIAL AND MANUFACTURING METHOD THEREOF

BACKGROUND OF THE INVENTION

1. Field of the Invention

The present invention relates to a heat spreader used for various devices and equipments, and more particularly to a silicon carbide based composite material having high thermal conductivity used as a heat spreader for a semiconductor device, as well as to a semiconductor device utilizing the same.

2. Description of the Background Art

There is a rapidly increasing demand in the market place for higher speed of operation and higher degree of integration of semiconductor devices recently. Accordingly, further improvement of thermal conductivity of a heat spreader for mounting semiconductor elements for the device has been required, so as to more efficiently radiate heat generated from the semiconductor elements. Further, in order to further reduce thermal strain between the semiconductor elements and other members (peripheral members) within the device arranged adjacent on the substrate, the heat spreader is required to have a coefficient of thermal expansion close to the elements and the members. More specifically, coefficients of thermal expansion of Si and GaAs which are commonly used for semiconductor elements are $4.2 \times 10^{-6}/°$ C. and $6.5 \times 10^{-6}/°$ C., respectively, and that of alumina ceramics used commonly as an enclosure member of the semiconductor device is about $6.5 \times 10^{-6}/°$ C., and therefore the heat spreader should desirably have a coefficient of thermal expansion close to these values.

Further, as the range of application of electronics equipment has been remarkably widened recently, semiconductor devices have come to be used in more various and wider applications. Among these, use in so-called semiconductor power device equipments including a high output AC converting equipment and frequency converting equipment has been increasing. In such devices, heat generation from a semiconductor element is several to several ten times (for example, several ten W) higher than from a semiconductor memory or a microprocessor. Therefore, a heat spreader used for such an equipment must have its thermal conductivity improved significantly, with the coefficient of thermal expansion adapted to have conformability with that of the peripheral members. Therefore, generally, the substrate has the following basic structure, for example. First, an Si semiconductor element is placed on an aluminum nitride (hereinafter referred to as AlN) ceramic substrate having high thermal conductivity as a first heat spreader. Thereafter, below the first heat spreader, a second heat spreader formed of a metal having high thermal conductivity such as copper is placed. Further, below the second substrate, a heat radiating mechanism which can be water-cooled or air-cooled is placed. By such a structure, heat is radiated without delay to the outside. Such a mechanism inevitably results in a complicated heat radiating structure. In this structure, assuming that AlN ceramics of about 170 W/m·K is used as the first heat spreader, the second heat spreader must let go the heat transmitted from the first substrate to the heat radiating mechanism therebelow. Therefore, the second substrate must have a high thermal conductivity of at least 200 W/m·K at a room temperature and low coefficient of thermal expansion of at most $10 \times 10^{-6}/°$ C., and more preferably, at most $8 \times 10^{-6}/°$ C. to attain conformability with the coefficient of thermal expansion with the first substrate.

Among the power devices, some devices generate large amount of heat when actually used, and when used with such devices, the heat spreader itself may be heated to 100° C. or higher. Therefore, sometimes it is required that the substrate has high thermal conductivity at such a high temperature. More specifically, one having thermal conductivity of at least 150 W/m·K at such a high temperature is required. The larger the capacity, the larger the size of the Si semiconductor element, and the larger must be the heat spreader on which the element is mounted. For example, a substrate used for a personal computer is about the size of 20 to 40 mm square at the largest, while a substrate exceeding the size of 200 mm square has been required for a power device with large capacity. Such a large substrate must have high dimensional precision at the time of packaging, and the precision must not be degraded even at a high temperature. More specifically, when the substrate warps or deforms at a high temperature, there would be a space at the interface between the substrate and the heat radiating mechanism (a radiator, a fin or the like) positioned therebelow, decreasing the efficiency of heat radiation. In the worst case, the semiconductor element may be damaged. Therefore, that the heat spreader surely has superior thermal conductivity at a high temperature is of critical importance.

Conventionally, a Cu—W based or Cu—Mo based composite alloy has been used for such a substance. Therefore, there has been a problem that the substrate costs considerably because of the expensive raw material, and that the subtrate is heavy. In view of the foregoing, various aluminum (hereinafter simply referred to as Al) composite alloys have been attracting attention as inexpensive and light materials. Among others, Al—SiC based composite alloy mainly consisting of Al and silicon carbide (hereinafter simply referred to as SiC) is a relatively inexpensive raw material, which is light weight and has high thermal conductivity. Commercially available pure Al itself and pure SiC itself have the densities of about 2.7 g/cm$^3$ and about 3.2 g/cm$^3$ respectively, and thermal conductivities of about 240 W/m·K and about 200 to 300 W/m·K, respectively. When the purity and defect density are further adjusted, thermal conductivities can be expected to be higher. Therefore, these are considered especially promising materials. Pure SiC itself and pure Al itself have coefficients of thermal expansion of about $4.2 \times 10^{-6}/°$ C. and about $24 \times 10^{-6}/°$ C., respectively, and it becomes possible to control the coefficient of thermal expansion in a wide range in the resulting composite material, which provides an additional advantage.

The Al—SiC based composite alloy and manufacturing method thereof are disclosed in (1) Japanese Patent Laying-Open No. 1-501489, (2) Japanese Patent Laying-Open No. 2-243729, (3) Japanese Patent Laying-Open No. 61-222668 and (4) Japanese Patent Laying-Open No. 9-157773. Reference (1) relates to a method of melting Al in a mixture of SiC and Al, and solidifying the same by casting process. References (2) and (3) both relate to infiltration of Al in voids or pores of a SiC porous body. Of these, reference (3)

is directed to a so-called pressure infiltration process in which Al is infiltrated under pressure. Reference (4) is directed to a method in which a compact or a hot pressed compact of a mixed powder of SiC and Al is placed in a mold, and subjected to liquid phase sintering in vacuum, at a temperature not lower than the melting point of Al.

The inventors of the present invention proposed in (5) Japanese Patent Application No. 9-136164 (Japanese Patent Laying-Open No. 10-335538, laid-open on Dec. 18, 1998, corresponding to U.S. patent application Ser. No. 08/874, 543), an aluminum-silicon carbide based composite material having thermal conductivity of at least 180 W/m·K obtained through liquid phase sintering. The composite material is obtained by compacting a mixture of SiC powder in the shape of particles, of 10 to 70 wt %, and Al powder, for example, and sintering the compact in a non-oxidizing atmosphere containing 99 vol % of nitrogen, with oxygen concentration of at most 200 ppm and dew point of not higher than $-20°$ C., at a temperature of 600 to 750° C. Further, the inventors of the present invention also proposed in (6) Japanese Patent Application No. 9-93467 (Japanese Patent Laying-Open No. 10-280082, laid open on Oct. 20, 1998), a so-called net shape aluminum-silicon carbide based composite material of which dimension after sintering is close to a practical size, having coefficient of thermal expansion of at most $18\times10^{-6}/°$ C. and thermal conductivity of at least 230 W/m·K. Further, the inventors of the present invention proposed in (7) Japanese Patent Application No. 11-28940 (corresponding to U.S. patent application Ser. No. 09/256,783), a method of manufacturing the same composite material combining atmospheric pressure sintering or pressureless sintering and HIP (Hot Isostatic Pressing). According to this method, a compact of Al—SiC based mixed powder having 10 to 70 wt % of SiC in the shape of particles, for example, is subjected to atmospheric pressure sintering in a temperature range of not lower than 600° C. and not higher than the melting temperature of Al in a non-oxidizing atmosphere containing at least 99% of nitrogen gas, and thereafter the compact is sealed in a metal container and subjected to HIP at a temperature of not lower than 700° C., whereby an aluminum-silicon carbide based composite material which is uniform and having thermal conductivity of at least 200 W/m·K is obtained.

Further, reference (4), that is, Japanese Patent Laying-Open No. 9-157773 discloses a method in which a mixture of Al powder and SiC powder is hot-pressed to perform compacting and sintering simultaneously. In this method, mixed powder containing 10 to 80 vol % of Al and remaining part of SiC is compacted, and the compact is hot-pressed with a pressure of at least 500 kg/cm$^2$ at a temperature not lower than the melting point of Al. By this method, an aluminum-silicon carbide based composite material having the thermal conductivity of 150 to 280 W/m·K is obtained by this method.

Though there are only a few references regarding the copper-silicon carbide based composite material where aluminum as the main metal component is substituted for by copper, as far as the knowledge and findings of the inventors of the present invention, such a composite material can be obtained by a method almost similar to the method as described above, by substituting copper (hereinafter simply referred to as Cu) for aluminum. Pure Cu itself has the density of about 8.9 g/cm$^3$, thermal conductivity of about 395 W/m·K and coefficient of thermal expansion of about $17\times10^{-6}/°$ C. Therefore, as compared with the aluminum based material, the resulting composite material comes to have higher density, and hence the effect of light weight is not to be much expected. By contrast, thermal conductivity of copper is higher by about 60% than that of aluminum, while the coefficient of thermal expansion is smaller by about 40% than that of aluminum. Therefore, as compared with the aluminum based material, the copper based material is advantageous in manufacturing a substrate material which requires high thermal conductivity and low coefficient of thermal expansion. Copper has a considerably higher melting point than aluminum and is heavier than aluminum, so that it is to some extent disadvantageous in view of manufacturing cost, as compared with aluminum based material.

When the composite materials as described above are to be used for a substrate of which large amount of heat radiation is required, especially for a heat spreader of which high heat radiation and larger practical size are required such as a substrate for a semiconductor power device, there still remains some problems as described in the following to be solved. Especially, when the peripheral members of the substrate have relatively small coefficient of thermal expansion, conformability with such members must as also be considered. On the other hand, ever higher thermal conductivity is required. For example, the level of thermal conductivity of a substrate used for a semiconductor power device as high as 280 W/m·K or higher will be required in the future. The silicon carbide based composite material obtained through the above described conventional methods has thermal conductivity of at most about 260 W/m·K, and the level of the thermal conductivity lowers as the amount of SiC increases. Therefore, such a material cannot be used for a substrate having low coefficient of thermal expansion.

For example, when the coefficient of thermal expansion of the Al—SiC base material described in reference (4), that is, Japanese Patent Laying-Open No. 9-157773 is to be set to at most $10\times10^{-6}/°$ C., the amount of SiC must be increased to at least 80 vol %. As a result, thermal conductivity decreases to 157 W/m·K or lower. When the same coefficient of thermal expansion is to be attained in the Al—SiC based material described in reference (5), that is, Japanese Patent Laying-Open No. 10-335538, the amount of SiC must be at least 60 vol %. As a result, thermal conductivity decreases to about 200 W/m·K. Further, when the same coefficient of thermal expansion is to be attained in the material fabricated through the method of reference (7) combining the atmospheric pressure sintering and HIP, the amount of SiC must be increased to at least 60 wt %, and as a result, the material comes to has thermal conductivity decreased to about 200 W/m·K or lower.

In the method of manufacturing an Al—SiC based composite material described in reference (1), a casting process is used in which melt Al is poured into a mold and SiC particles are dispersed and solidified. Therefore, because of the difference in density of Al and SiC, segregation of SiC particles occur in the compact when cooled, and as a result, the solidified body tends to have uneven composition. Therefore, the surface of the solidified body is unavoidably covered by a coating layer (hereafter the layer will also be referred to as Al coating layer) formed of Al or Al alloy. The thickness of the coating layer varies considerably portion by portion on the surface of the solidified body. Further, the surface portion of the solidified body consisting of the coating layer and the inner portion of the solidified body have considerably different coefficients of thermal expansion, and therefore when heat is conducted to an interface therebetween, there would be thermal stress. Therefore, when the material with the coating layer left is used as the heat spreader for mounting semiconductor elements, the substrate warps or deforms because of the generated thermal stress, resulting in cracks between the substrate and the semiconductor elements or peripheral members, deformation of the semiconductor elements or deformation or damage to the semiconductor elements or peripheral members. Therefore, the coating layer must be completely removed in advance. This removal involves processing of a portion where a phase mainly consisting of Al which is soft and ductile, and a phase containing SiC of high rigidity co-exist, as the thickness of the coating layer varies. Accordingly, the process is difficult.

In the method of manufacturing an Al—SiC based composite material described in references (2) and (3), Al is infiltrated in the voids or pores of porous SiC body. Here, it is necessary to prevent shrinkage cavity of melt Al as observed in casting steel, and to fully fill Al in the pores of SiC to provide dense composite alloy. For this purpose, generally, excessive Al is provided as an infiltrating agent on an outer periphery of the porous SiC body. After infiltration, the excessive Al eludes and is fixed on the outer periphery of the infiltrated body, and removal of this excessive Al requires considerable time and labor. In the method described in reference (5) in which mixed powder mainly consisting of Al and SiC is compacted in advance and sintered, when sintering is performed at a temperature higher than the melting point of Al, similar phenomenon is observed, though to a limited extent.

In order to prevent such elusion and fixation of Al on the outer periphery, there is one approach as described in reference (6) in which a thin layer consisting of a mixture of an elusion preventing agent and an infiltration accelerator accelerating infiltration is formed on an outer periphery of the SiC porous body before infiltration of Al. Application and removal of such layer after infiltration, however, requires time and labor.

The pressure infiltration process described in reference (3) includes the steps of placing the SiC porous body in a mold allowing uniaxial pressing, placing Al or Al alloy thereon, melting Al in vacuum and forcing Al into the SiC porous body by external uniaxial pressing. In this case, finally, the infiltrated body is gradually cooled from below with a temperature gradient. At this time, as there is large difference in coefficients of thermal expansion between the SiC skeleton and the portion filled with Al in the infiltrated body, it is likely that Al is drawn into the infiltrated body when cooled, possibly resulting in portions not infiltrated with Al (which corresponds to the shrinkage cavity mentioned above). Therefore, a complicated control mechanism capable of highly precise control of the temperature gradient for cooling and control of pressurizing heating program simultaneously is required. This means that the overall apparatus for this process inevitably becomes expensive.

The method of hot pressing in a mold described in reference (4) suffers from the following problems in production and quality. When a continuous type hot press apparatus is used, for example, it becomes necessary to provide vacuum atmosphere and to suppress flowing out of melt substance from the mold, in order to increase the temperature of the atmosphere to be higher than the melting point of Al. Therefore, when the target material of uniform composition is to be obtained while suppressing variation in compositions, a very expensive manufacturing apparatus is necessary. When a batch type apparatus is used, flow out of the melt substance from the mold can be suppressed to a higher extent as compared with the continuous type apparatus. On the other hand, however, the series of steps including loading of the compact into the mold, keeping a prescribed temperature program and cooling must be repeated intermittently, which means lower productivity.

As described in detail above, conventional manufacturing of Al—SiC based composite material involves several problems in quality and production. Therefore, though Al—SiC based composite material has been recently attracting attention as a promising material in its performance as one of the substrates of which high heat radiation characteristic is required, such as a substrate for a semiconductor power module, the composite material of satisfactory performance has not yet been obtained by any of the conventional casting process, infiltrating process, sintering process, hot pressing or combination of these processes. One possible reason may be the following. Conventionally, in order to improve wettability between Al and SiC to promote voluntary infiltration of Al melt to spaces between SiC particles, or to suppress generation of voids, it has been a common practice to add a sub composition such as Si to Al, or to use Al containing such a sub composition as an impurity. Lowering of thermal conductivity of the composite material resulting from the existence of such sub composition has been inevitable. It is noted that though SiC itself has high thermal conductivity comparable to or higher than that of Al, the conventional Al—SiC based composite material has low thermal conductivity at a region where the amount of SiC content is high.

Generally, thermal conductivity of a substance is a function of density, specific heat and thermal diffusivity of the substance, as represented by the following equation.

Thermal conductivity=density×specific heat×thermal diffusivity (1)

Specific heat of a composite material is determined by the composition ratio. For example, the specific heat of SiC is 0.174 cal/g·° C. and that of Al is 0.22 cal/g·° C. The specific heat of Al—SiC composite is expressed by $Cp=0.174 \times V_{SiC} + 0.22 \times V_{Al}$ wherein $V_{SiC}$ and $V_{Al}$, are the volume fraction of SiC and Al respectively. Therefore, if the composition is the same, the density and the thermal diffusivity must be increased to improve thermal conductivity. The conventional Al—SiC based composite material described above has the thermal conductivity of about 200 W/m·K with the density of not lower than 99%, and therefore, in order to improve thermal conductivity, it is particularly necessary to improve thermal diffusivity.

It is considered that the thermal diffusivity of the Al—SiC based composite material is determined by the thermal diffusivities of Al and SiC as well as the state of adhesion at the interface between the two phases. The degree of adhesion at the interface between the two phases basically improves as the density becomes higher. Therefore, the most important factor to increase thermal diffusivity of the Al—SiC based composite material is to increase thermal diffusivity of the two composition phases, especially that of SiC phase.

SUMMARY OF THE INVENTION

Therefore, an object of the present invention is to provide an aluminum-silicon carbide based and copper-silicon carbide based composite materials having thermal conductivities far superior to the prior art and to provide inexpensive manufacturing method thereof, to solve the problems in quality and production of the conventional silicon carbide based composite materials described above. The inventors focused on the improvement of thermal conductivity in the region where SiC content is high, in order to solve the conventional problems described above, which led to the present invention.

More specifically, the silicon carbide based composite material provided by the present invention includes as a first component, metal mainly consisting of aluminum or copper, and as a second component, particles mainly consisting of silicon carbide, wherein the silicon carbide particles constituting the composite material have high purity and few defects. The content of iron element and aluminum element in the silicon carbide particles are both at most 0.01 wt. %, and preferably, the contents are both at most 0.005 wt. %.

When the first component is the metal mainly consisting of aluminum, the content and thermal conductivity of the silicon carbide particles represented as x wt % and y W/m·K, respectively, satisfy the following relation.

$$y \geq 0.214x+173 \text{ (where } 10 \leq x \leq 80) \tag{2}$$

Alternatively, the content and the thermal conductivity satisfy the following relation.

$$2.410x+226 \geq y \geq 0.286x+180 \text{ (where } 10 \leq x \leq 80) \tag{3}$$

Or alternatively, the content and the thermal conductivity satisfy the following relation.

$$2.410x+226 \geq y \geq 0.250x+270 \text{ (where } 20 \leq x \leq 80) \tag{4}$$

$$2.410x+226 \geq y \geq 300 \text{ (where } 30 \leq x \leq 80) \tag{5}$$

Of the composite materials, specifically, the silicon carbide based composite material of the present invention encompasses one in which lattice constant of aluminum in aluminum or aluminum alloy as the first component is at most 4.053 Å.

When the first component is a metal mainly consisting of copper, the content and thermal conductivity of the silicon carbide particles represented as x wt % and y W/m·K, respectively, satisfy the following relation.

$$y \geq -0.50x+245 \text{ (where } 10 \leq x \leq 80) \tag{6}$$

Alternatively, the content and the thermal conductivity satisfy the following relation.

$$0.333x+393 \geq y \geq -0.5x+250 \text{ (where } 10 \leq x \leq 80) \tag{7}$$

Alternatively, the content and the thermal conductivity satisfy the following relations.

$$0.333x+393 \geq y \geq -1.333x+417 \text{ (where } 20 \leq x \leq 80) \tag{8}$$

and $$0.333x+393 \geq y \geq -1.1x+418 \text{ (where } 20 \leq x \leq 80) \tag{9}$$

Among the composite materials containing aluminum or copper described above, a material is included in which the silicon carbide particles include silicon carbide particles having 6H type crystal structure.

The present invention also covers various semiconductor devices such as power modules using the above described composite materials (as members).

A method of manufacturing a silicon carbide based composite material provided by the present invention includes the steps of: preparing a raw material containing a first component including metal mainly consisting of aluminum or copper and a second component mainly consisting of silicon carbide; mixing the raw material including the first and second components such that content of the silicon carbide attains 10 to 80 wt % to provide a mixture; compacting the mixture to form a compact body; heating the compact body at a temperature not lower than the melting point of the metal mainly consisting of aluminum or copper and thereafter forging the compact body under pressure to form a forged body.

Another method of manufacturing a silicon carbide based composite material provided by the present invention includes the steps of preparing a raw material containing a first component including metal mainly consisting of aluminum or copper and a second component mainly consisting of silicon carbide; and using the raw material, providing silicon carbide based composite material containing 10 to 80 wt % of silicon carbide by infiltration process, sintering process, hot press or casting process, without forging under pressure.

The sintering process, infiltration process and, hot pressing and casting process utilized in the aforementioned another method of manufacturing the silicon carbide based composite material of the present invention will be defined. The sintering process refers to the process in which the second component mainly consisting of silicon carbide (hereinafter simply referred to as the second component) and the first component including metal mainly consisting of aluminum or copper (hereinafter simply referred to as the first component) are, from the start, mixed in the final composition, and the mixture is sintered at a temperature not lower than the melting point of the first component. The infiltration process refers to the process in which powder compact of the second component is sintered to provide a porous body, and the first component is infiltrated into the voids or pores of the porous body to attain the composite material of the final composition. A process referred to as pre-mixed infiltration has also been known, in which the first component smaller in amount than the final content is pre-mixed in the second component at first, the powder compact is sintered to provide a porous body, and the first component only of the missing amount is infiltrated to the voids of the porous body to attain the composite material of the final composition. In the present invention, this process is encompassed by the infiltration process. The above described pressure infiltration process is also encompassed by the infiltration process. The hot pressing refers to a method in which a material fabricated by the above described sintering process.infiltration process or the compact before sintering is mechanically hot pressed to attain higher density. The casting process refers to a method in which a mixture of the first component and the second component is prepared in advance, the mixture with the first component melt is cast into a mold, or in which a melt of the first component is poured into the mold, then necessary amount of the second component is dispersed in the melt, and thereafter cooled to provide the composite material.

In accordance with the present invention, in the step of preparing the raw material in the manufacturing method of the above described two aspects, highly pure silicon carbide powder is used of which amount of oxygen is at most 1 wt %, the amount of component containing iron is in iron element equivalent, at most 0.01 wt %, and the amount of component containing aluminum is, in aluminum element equivalent, at most 0.01 wt %. Further, preferably, highly pure silicon carbide powder is used of which amount of oxygen is at most 0.1 wt %, the amount of component containing iron is, in iron element equivalent, 0.005 wt %, and the amount of component containing aluminum is, in aluminum element equivalent, at most 0.005 wt %. Further, the present invention encompasses a method including the step of preheating commercially available silicon carbide powder as the starting material in an inert gas atmosphere at a temperature range of 1600 to 2400° C., as a method of preparing silicon carbide powder containing oxygen and iron with small amount of impurity. Further, the present invention encompasses a method including the step of preliminary acid treatment in which commercially available silicon carbide powder is dipped in an acid solution containing at least one of hydrofluoric acid, nitric acid and hydrochloric acid. A method including both the preliminary acid treatment and preliminary heating is also covered. In that case, preliminary acid treatment is followed by the preheating. The silicon carbide powder to be subjected to the preheating or preliminary acid treatment should preferably have the 6H or 4H type crystal structure. The 6H type crystal structure is more preferable.

In the step of providing a forged body in the method of manufacturing a silicon carbide based composite material in accordance with one aspect of the present invention, preferably, the pressure should be at least 1 ton/cm$^2$ and more preferably, at least 5 ton/cm$^2$, as the forging condition. Further, hot forging is preferred, with the time of heating should be as short as at most 15 minutes and more preferably, at most 1 minute.

The present invention also encompasses the method of manufacturing including the step of heat treatment in which the forged body provided by the method in accordance with one aspect described above or the composite material element obtained through the method in accordance with the aforementioned another aspect is heated at a temperature Th lower than the melting point Tm of the metal mainly consisting of aluminum or copper. Here, preferably, the heat treatment temperature Th satisfies the relation of Th>Tm−100.

As described in detail above, the present invention provides Al—SiC based or Cu—SiC based silicon carbide based composite material in which silicon carbide (SiC) particles have high purity and few defects, and as a result, provides silicon carbide based composite material having high thermal conductivity. Particularly, silicon carbide powder raw material purified by reducing the amount of impurities such as the component including transitional metal by preliminary treatment of dipping in acid or heating is used and final solidification is performed by forging, it becomes possible to provide the composite material having thermal conductivity far superior than the prior art. Further, the step of purifying silicon carbide by the preliminary treatment and/or heating process at a temperature lower than the melting point of the Al based component or Cu based component after solidification can be applied to the conventional infiltration process, sintering process, casting process or the like to further enhance thermal conductivity. Therefore, the silicon carbide composite material in accordance with the present invention is useful heat spreader on which a semiconductor element is mounted, especially as a heat spreader of high reliability for a high output power module.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The silicon carbide based composite material provided by the present invention can be generally classified into a composite material containing the first component including a metal mainly consisting of aluminum and the second component mainly consisting of silicon carbide (hereinafter also referred to as Al—SiC based composite material or simply Al—SiC base) and a composite material containing the first component including metal mainly consisting of copper and the second component mainly consisting of silicon carbide (hereinafter referred to as Cu—SiC based composite material or simply Cu—SiC base). The present invention was made focusing on these materials to improve thermal conductivity of a heat spreader (heat sink), especially the heat spreader for semiconductor devices.

Figure 1:
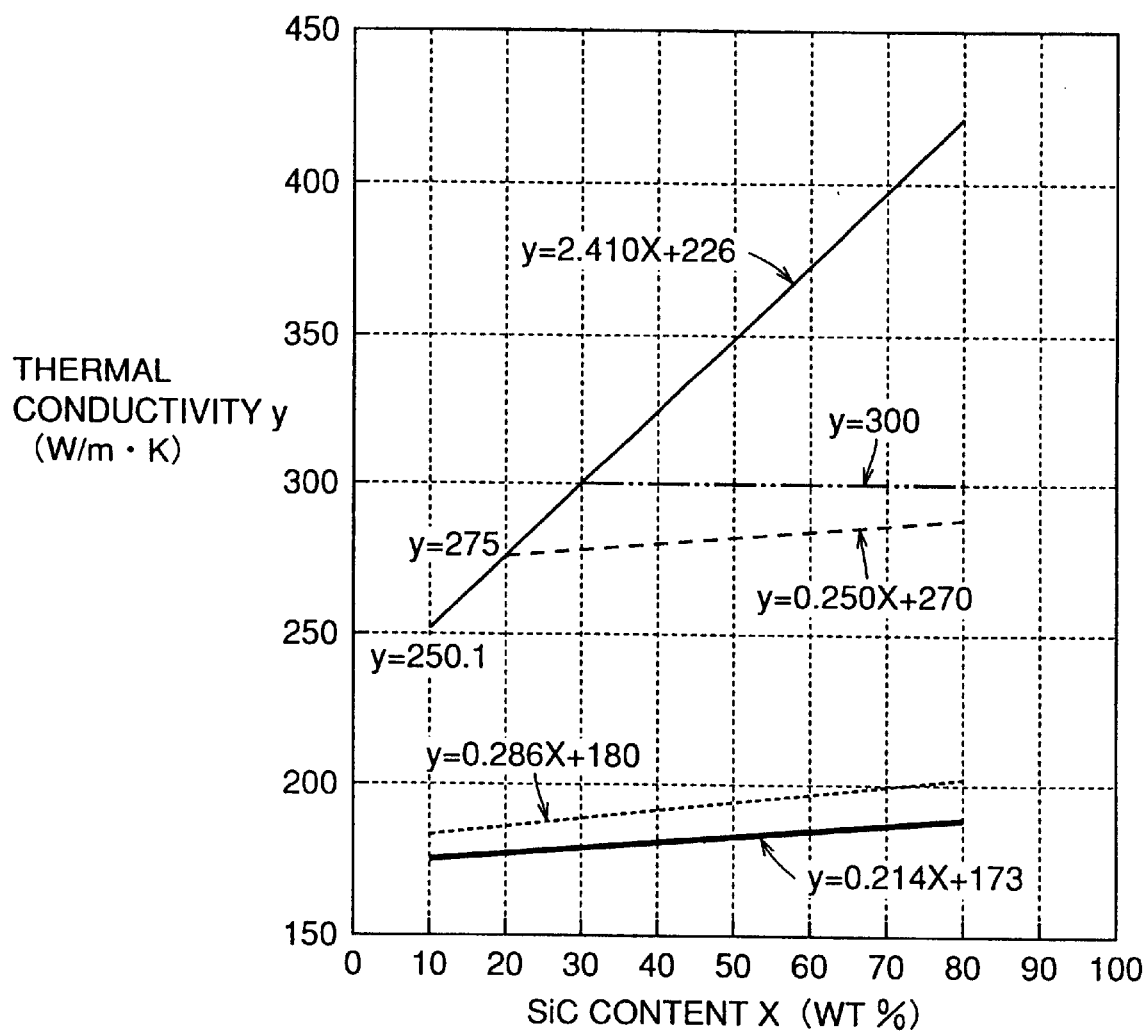
FIG. 1 is a graph representing relation between the amount of SiC and thermal conductivity of the Al—SiC based composite material in accordance with the present invention.

One of the silicon carbide based composite materials provided by the present invention is the Al—SiC based composite material. When the content and the thermal conductivity of the silicon carbide particles are represented as x wt % and y W/m·K, respectively, x and y satisfy the relations represented by equations (2) to (5). Relation between the amount of silicon carbide (also referred to as SiC) particles, x (wt %) and the thermal conductivity y (W/m·K) is as shown in FIG. 1. Here, the range of y represented by the equation (2) corresponds to the portion above the thick solid line of the graph. The range of y represented by the equation (3) corresponds to a portion between the dotted line and the uppermost thin solid line of the graph, the range of y represented by the equation (4) corresponds to the portion between the broken line and the uppermost thin solid line, and the range of y represented by the equation (5) corresponds to the portion between the two-dotted line and the uppermost thin solid line, respectively. Of these, the portion above the thick solid line represented by the equation (2) represents the range of y obtained through the method of manufacturing in accordance with the above described one aspect. The portion between the dotted line and the uppermost thin solid line represented by the equation (3) represents the range of y obtained by the manufacturing method in accordance with the aforementioned another aspect of the present invention. The portions between the dotted line or the two dotted line and the uppermost thin solid line represented by the equation (4) or (5) corresponds to the range of y obtained through the method of manufacturing in accordance with the above described two aspects of the present invention, with silicon carbide powder of high purity with a low oxygen amount and a low amount of cation impurity element, especially, silicon carbide powder with high purity and few iron element impurities being used.

In one silicon carbide based composite material in accordance with the present invention, lattice constant of aluminum contained therein exhibits a value close to the lattice constant of pure aluminum of 4.0494 Å. The material obtained through the manufacturing method including the step of forging and using highly pure silicon carbide raw material described above has aluminum lattice constant not higher than 4.051 Å. These values cannot be attained by the various conventional manufacturing methods described above. These values prove that the crystal lattice of aluminum in the silicon carbide based composite material in accordance with an aspect of the present invention is hardly distorted. This is a reason why the composite material in accordance with one aspect of the present invention has higher thermal conductivity than the conventional similar material. The relation between this point and the manufacturing method will be described in detail later.

Figure 2:
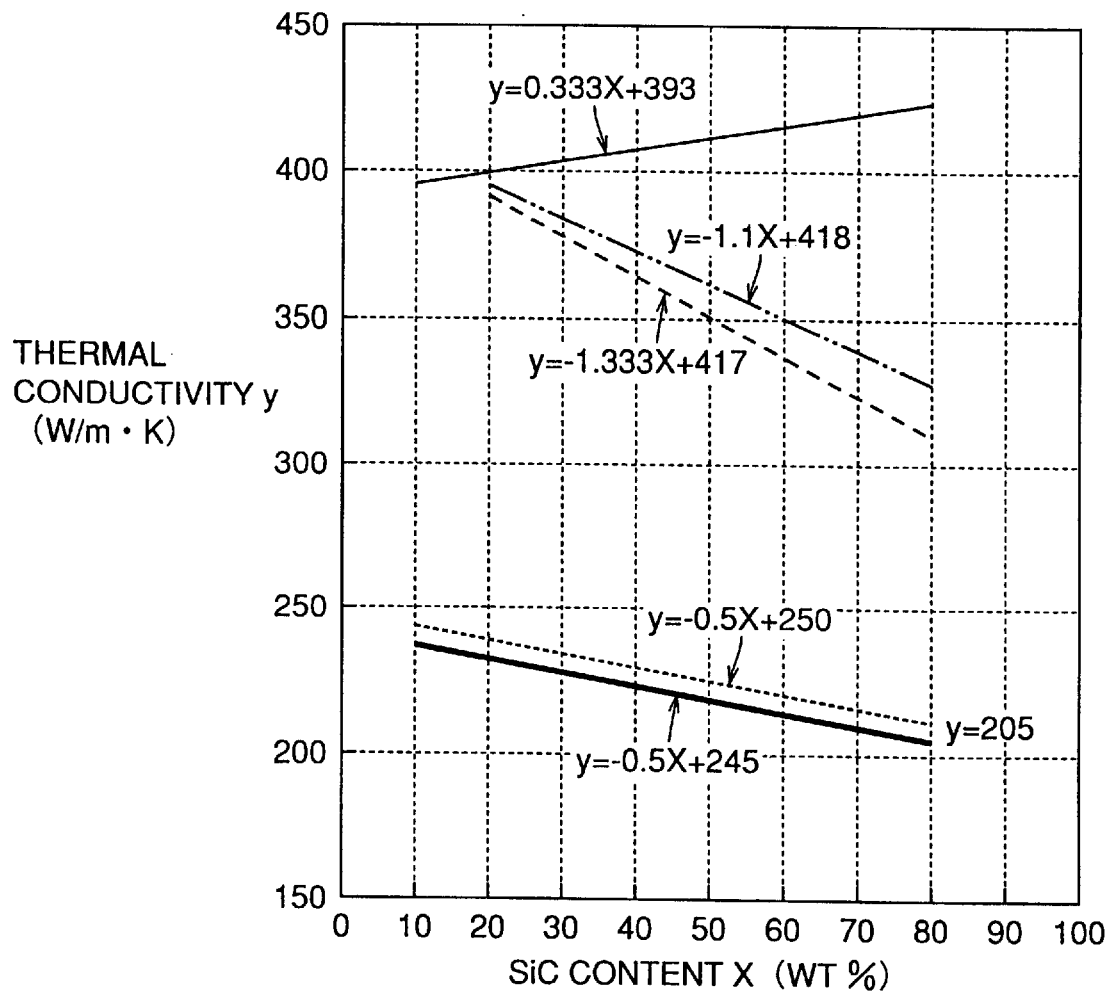
FIG. 2 is a graph representing relation between the amount of SiC and thermal conductivity of the Cu—SiC based composite material in accordance with the present invention.

Another silicon carbide based composite material in accordance with the present invention is Cu—SiC based composite material. When the content and the thermal conductivity of the silicon carbide particles are represented as x wt % and y W/m·K, x and y satisfy the relations represented by equations (6) to (9). The relation between the content of SiC (wt %) x and thermal conductivity y (W/m·K) is as shown in FIG. 2. The range of y represented by the equation (6) corresponds to the portion above the thick solid line of the graph. The range of y represented by the equation (7) corresponds to a portion between the dotted line and the uppermost thin solid line of the graph, the range of y represented by the equation (8) corresponds to the portion between the broken line and the uppermost thin solid line of the graph, and the range of y represented by the equation (9) corresponds to the portion between the two dotted line and the uppermost thin solid line of the graph, respectively. Of these, the portion above the thick solid line represented by the equation (5) represents the range of y obtained through the method of manufacturing in accordance with the aforementioned one aspect of the present invention, the portion between the uppermost thin solid line and the dotted line represented by the equation (6) represents the range of y obtained through the manufacturing method in accordance with the aforementioned another aspect of the present invention, and the portion between the broken line and the uppermost thin solid line represented by the equation (7) represents the range of y obtained by the manufacturing methods of the two aspects when high purity silicon carbide powder containing an especially low oxygen amount and iron element amount is used.

In the silicon carbide based composite material in accordance with another aspect of the present invention, lattice constant of copper contained therein has a value closer to that of pure copper. This proves that crystal lattice of the copper in the silicon carbide based composite material in accordance with this aspect of the present invention is hardly distorted. This is the reason why the composite material in accordance with this aspect of the present invention has higher thermal conductivity than the conventional similar material.

The method of manufacturing the silicon carbide based composite material in accordance with the present invention will be described in the following. The method of manufacturing a silicon carbide based composite material in accordance with one aspect of the present invention includes, as described above, the steps of: preparing a raw material containing the first component including a metal mainly consisting of aluminum or copper and the second component mainly consisting of silicon carbide; mixing the raw material containing the first and second components such that the amount of silicon carbide attains 10 to 80 wt % to provide a mixture; compacting the mixture to form a compact body; and heating the compact body at a temperature not lower than the melting point of the metal mainly consisting of aluminum or copper and forging the compact body under pressure to provide a forged body. As already described, by this method, Al—SiC based composite material having the thermal conductivity in the range satisfying the relation of equation (2) and Cu—SiC based composite material having the thermal conductivity in the range satisfying the relation of equation (6), respectively, can be obtained.

The method of manufacturing a silicon carbide based composite material in accordance with another aspect of the present invention includes the steps of: preparing a raw material containing the first component including a metal mainly consisting of aluminum or copper and the second component mainly consisting of silicon carbide powder; and providing silicon carbide based composite material containing 10 to 80 wt % of silicon carbide by infiltration process, sintering process, hot pressing or casting process, without forging under pressure, using the raw material.

In the manufacturing method in accordance with one aspect of the present invention, forging process is selected as means to making dense and composing the composite material. As already described, conventionally adopted infiltration process and hot pressing are low in productivity, and the resulting thermal conductivity is considerably lower than the theoretical value. Sintering process and forging process are superior in productivity to these processes to some extent. However, similar to infiltration process and hot pressing, the resulting thermal conductivity is considerably lower than the theoretical value. The theoretical value of the thermal conductivity here refers to a value calculated from the composition ratio in accordance with the rule of mixture, using the value of each of the above described first and second components as single element.

In the infiltration process, slurry containing SiC powder and an organic binder added thereto is compacted and sintered to fabricate a porous body, to which Al or Cu is infiltrated. Therefore, this process has lengthy process steps. In the sintering process, final composition can be obtained by one sintering operation, and therefore productivity is higher than the infiltration process. However, the time required for increasing and decreasing temperature is long, and it is difficult to provide products of complicated shape of uniform quality. Further, both in the infiltration process and sintering process, if the wettability between the melt of the first component and the second component is insufficient, dense product cannot be obtained. For this reason, it becomes inevitable to add sub composition to improve wettability between the first and second components in advance. Addition of such sub composition inevitably lowers thermal conductivity. In the hot press processing, the composite material element fabricated by these methods is subjected to re-pressing, resulting in lower productivity. Though casting process has the highest productivity among the processes described above, it is difficult to obtain products of uniform quality. Further, in order to improve wettability of the two components, addition of the sub composition is inevitable as described above, and as a result, thermal conductivity inevitably lowers.

The inventors have found that in order to solve these problems, forging process is especially effective. More specifically, by this process, material having relative density of almost 100% can be obtained in a shorter time for increasing and decreasing temperature as compared with the conventional processes described above. When forging is performed with a high load pressure of 1 ton/cm$^2$ or higher, for example, at a temperature not lower than the melting point of Al or Cu, SiC particles in the compact are partially pulverized to be fine particles, and the fine particles fill spaces of the skeleton formed of relatively coarse particles (effect of fine SiC particles). Therefore, even when relatively coarse particles of SiC powder are used, skeleton after forging comes to be dense, and spaces between SiC particles can be filled quickly by Al or Cu. As a result, a composite material which is denser than that obtained through the conventional hot pressing can be obtained in a simple manner.

Preferably, the forging pressure should be at least 1 ton/cm$^2$. Especially in a composition region where SiC content exceeds 50 wt % or at a temperature not lower than the melting point of Al, Cu or an alloy thereof (generally 650° C. for pure Al and 1083° C. for pure Cu), the compact body has large formation resistance, so that voids tend to remain, lowering thermal conductivity of the fabricated composite material. Therefore, desirably, forging should be performed under the pressure of at least 5 ton/cm$^2$. At a composition region where SiC content is smaller than 50% and the content of Al or Cu is large, physical adhesion between particles of these two compositions may proceed rapidly by synergistic effect of ductility of Al or Cu and the effect of fine SiC particles described above, even in cold forging with the pressure of 1 ton/cm$^2$ or higher, provided that two main components are dispersed uniformly in advance. As a result, though voids are left to some extent, a material having relative density of at least 80% can be obtained. The higher the temperature of forging, the region of composition providing the comparable level relative density shifts to the side of larger SiC content. When the forging temperature exceeds the melting point of Al or Cu, the effect of fine particles of SiC described above and rapid filling of Al or Cu melt into the spaces between SiC particles readily promotes the process of making dense the material, and hence the composite material having high density and high thermal conductivity can be obtained in a shorter time period as compared with the conventional methods. Though the forging temperature may be set high, when the forging pressure attains 10 ton/cm$^2$ or higher at a temperature not lower than the melting point of Al and Cu, the effect of densing and resulting effect of increased thermal conductivity are saturated.

The heating temperature of the compact in the step of forming a forged body depends on the forging pressure and the SiC content as described above. Considering the influence of the degree of adhesion between particles of the main components mentioned above on the thermal conductivity, the temperature should desirably be not lower than the melting point of Al or Cu. As to the method of heating the compact before forging, general method used for the common sintering furnace may be possible. In order to avoid interfacial reaction between the two main components or between the main component and the impurity contained therein and to avoid solid solution phenomenon of the impurity into the crystal lattice of the main component as much as possible as will be described later and to obtain a material having high thermal conductivity, however, a method of heating which is capable of increasing/decreasing temperature in a relatively short time period to the inside of the compact quickly is advantageous. Such heating method may include, for example, plasma heating method, electromagnetic induction heating method and microwave heating method. When this type of heating method is adopted, the compact is uniformly and quickly heated from the inside, and therefore, the composite material having high thermal conductivity, which is the object of the present invention, can be obtained simply by holding the compact at a target temperature for at least about several seconds. Further, as volatile component such as water vapor and OH group and the like existing inside the compact is rapidly volatilized or dissolved, oxidation of Al or Cu can advantageously be avoided, without the necessity of heating in a non-oxidizing atmosphere such as nitrogen. Therefore, when forging is performed by such a heating method in a short period of time within several seconds, for example, the process may be performed in air without any major problem.

In the common heating method, uniform heating requires ten and several minutes, and therefore in that case, inert gas atmosphere of nitrogen, argon or the like is preferred. When the heating temperature is too high, in the Al—SiC based material, aluminum carbide ($Al_4C_3$) generates by the reaction of Al with SiC, possibly lowering thermal conductivity. Though it relates to the heating time, the desirable heating temperature is at most 200° C. higher than the melting point of Al or Al alloy. Especially, electromagnetic induction heating can restrain the formation of $Al_4C_3$ due to its short heating period.

As to the temperature of the mold at the time of forging, the higher is more desirable. When the temperature of the mold is low (for example, at a room temperature), the heated material may be cooled, hindering the process of increasing density. Where forging at a temperature not lower than the melting point of Al is appropriate, if the temperature of Al attains lower than the melting point, the expected thermal conductivity may not be obtained. The setting of the mold temperature is related to the heating temperature before forging, and therefore it cannot be automatically determined. However, the temperature of 200° C. or higher is desired. When the temperature exceeds 600° C., the strength of the mold may possible be degraded, and therefore the most desirable range is about 200 to about 500° C.

In the step of forming a forged body of Al—SiC base, for example, the heating means ensuring shorter heating time as described above also provides the following advantage. Generally, when a compact mainly consisting of Al and SiC is heated, the following reaction gradually occurs at the interface between Al and SiC.

$$3SiC+4Al \rightarrow Al_4C_3+3Si \qquad (10)$$

The reaction proceeds more as the heating time becomes longer. In the conventional infiltration process, sintering process, forging process and hot press, heating of a long time by at least the unit of an hour is generally necessary so as to ensure uniform heating of the compact body, uniform infiltration.penetration of Al into the compact body, and sufficient adhesion at the interface of Al and SiC. As a result, much amount of aluminum carbide ($Al_4C_3$) having low thermal conductivity generates, inevitably lowering the thermal conductivity of the overall composite material. By contrast, in accordance with the method of the present invention in which the compact body can be made dense and composed by the step of forging requiring heating for a short period of time, lowering of thermal conductivity of the composite material resulting from the generation of aluminum carbide can be minimized.

As described above, in the conventional infiltration process or sintering process under normal pressure, it is necessary to improve wettability between Al or Cu and SiC by adding an alloying component, so as to attain sufficient adhesion at the interface of these components. For example, when pure Al is used, it is necessary to add Si or Mg or a transition metal such as Ti, V or Mn, and when pure Cu is used, it is necessary to add as the sub composition, similar transition metal. As a result, the high thermal conductivity of the pure Al or pure Cu cannot be fully exhibited. When Mg or Si is added to Al in the Al—SiC base as described above, wettability between Al and SiC is much improved, facilitating infiltration or sintering. The addition of Si also restrains the progress of the formation of $Al_4C_3$ shown in the equation (10). However, such an alloying component results in solid solution in the crystal of Al or Cu, which considerably lowers thermal conductivity of the composite material. Solid solution of such alloying component in the crystal of Al or Cu increases distortion of crystal lattice of Al or Cu (which means that one having lattice constant closer to that of pure Al or pure Cu cannot be obtained), and therefore the inherent high thermal conductivity cannot be exhibited. By contrast, through the method of manufacturing in accordance with one aspect of the present invention, high adhesion between pure Al or pure Cu and SiC and high thermal conductivity can be ensured because of the forging step, even when pure Al or pure Cu is used as the main raw material. However, the addition of Si to Al is also permitted in the present invention.

Generally, in order to obtain a composite material having high thermal conductivity, it is desired to use a main component essentially having high thermal conductivity and high purity as the raw material. Generally, however, such a raw material of high purity is expensive. Therefore, in manufacturing the composite material in accordance with the present invention, it is of highest importance to obtain or prepare a raw material which is as inexpensive as possible, for both of the two composite materials described above. This is important in either of the manufacturing methods in accordance with the two aspects of the present invention in the step of preparing the raw material containing the first component including metal mainly consisting of aluminum or copper and the second component mainly consisting of silicon carbide powder as main component raw materials.

Silicon carbide, which is the main component of the silicon carbide based composite material of the present invention, has been known as a ceramic material having very high thermal conductivity among ceramics. Therefore, the silicon carbide particles having high purity and few defects in accordance with the present invention mentioned above will be described in the following. In such ceramics, the media of thermal conductivity is basically phonons. Generally, there are many defects in the silicon carbide particles. The defects include point defects, stacking faults resulting from the stacked state of atoms in the C axis direction of the SiC crystal lattice, dislocation derived from solid solution of impurity, crystal distortion resulting from mechanical pulverization of the particles and carrier concentration in crystal. Such defects all hinder thermal conductivity in the crystal by phonons. The inventors have found that among the aforementioned causes, stacking faults and the amount of impurity have the largest influence. The influence of these factors much depends on the method of preparing the SiC raw material powder.

The SiC powder may be prepared by (1) a method of reacting silicon dioxide ($SiO_2$) or silicon (Si) powder with carbon (C) powder, (2) the method of direct carbonization of Si, that is, the method of reacting Si with C component such as cokes, and (3) the method in which SiC powder prepared by the method of (1) or (2) is heated and sublimated at a temperature of at least 2000° C. to provide Si and C gases and re-depositing the gases. In any of these methods, it is possible to obtain highly pure SiC powder by reducing the amount of metal impurity of $SiO_2$, C, SiC or Si powder as the starting material in advance. Especially by the method (3), fine particle powder of very few stacking faults can be obtained, as SiC powder is re-deposited from the gas phase. Further, the powder does not require pulverization in mixing, and therefore mechanical internal distortion is not generated in the particles. Therefore, as compared with the commercially available material, it has higher thermal diffusivity. The impurity existing mixed in the SiC raw material includes nitrogen, oxygen, carbon and iron (Fe), transition metal such as titanium (Ti), chromium (Cr), vanadium (V), nickel (Ni) or the like, or component containing such metal. Such impurity exists on the surface of SiC particle or in the particle, and the impurity existing inside lowers the thermal diffusivity of the SiC crystal particle itself. Though the impurity near the surface can be removed by preliminary acid treatment of the raw material powder, which will be described later, the impurity inside cannot be removed substantially. Therefore, in order to obtain a composite material of high thermal conductivity, it is desirable to use SiC raw material with as few as possible impurity in the particles. The method, however, has low production yield and therefore incurs much cost. For example, acid treatment in which the raw material is dipped in pressurized and heated acid for a long period of time is required.

In view of the foregoing, the inventors conceived the method (4) in which defects once introduced into the SiC powder are removed by heat treatment. As a result, the inventors have found that by heating under a prescribed condition, it is possible to effectively move dislocations existing therein, so that the amount of stacking faults in the SiC crystal particles can be reduced. Further, the inventors have found that depending on the heating condition, SiC itself is sublimated and re-deposited, whereby powders almost free of any defect can be obtained. In the powder thus obtained, the crystal particles themselves have high thermal conductivity.

In the method of manufacturing a composite material in accordance with the present invention, in the step of preparing the raw material, commercially available powder may be selected as the SiC raw material powder. It is desirable, however, to select commercially available powder in which the amount of impurity in the crystal particles is small, or to pre-heat (reheating treatment) the selected powder. Therefore, in the present invention, in the step of preparing the raw material in the manufacturing methods of the above described two aspects, when selecting the commercially available powder, SiC raw material powder is preferably selected in which oxygen content is at most 1 wt %, the content of cation impurity element, especially the content of component including iron is, in iron element equivalent, at most 0.01 wt %, and the content of component including aluminum is, in aluminum element equivalent, 0.01 wt %. More preferably, the raw material powder in which the oxygen content is at most 0.1 wt %, the content of component including iron is, in iron element equivalent, at most 0.005 wt % and the content of the component including aluminum is, in aluminum element equivalent, at most 0.005 wt % is selected. When the oxygen content and the amounts of iron and aluminum containing components in equivalent of iron and aluminum elements exceed the aforementioned levels, the thermal conductivity of the composite material tends to decrease. Further, in the present invention, in order to reduce the amount of oxygen or cation impurity element, especially iron in the selected SiC powder, the SiC powder as the starting material is preferably subjected to preliminary heat treatment in inert gas atmosphere at a temperature range of 1600 to 2400° C. Preferably, preliminary acid treatment is performed in which the SiC powder as the starting material is dipped in an acid solution containing at least one of hydrofluoric acid, nitric acid and hydrochloric acid. By such treatment, even the powder containing an impurity to some extent can have its purity improved to aforementioned level of selection. Such treatments may be both performed as described above. In that case, preliminary acid treatment is performed first, followed by the preliminary heat treatment. The effect of acid treatment is promoted by heating (at a temperature not lower than 100° C., for example). Preferably, as the SiC powder to be subjected to the preliminary heating treatment or preliminary acid treatment described above, the powder having as high thermal conductivity as possible should be selected. Though the characteristic of SiC powder derived from the crystal type will be described later, preferably, SiC powder of which particle crystal type is 6H or 4H type should mainly be selected. Especially, the crystal of 6H in which crystal symmetry is high, should be selected mainly.

In preliminary heat treatment of SiC powder, when nitrogen or carbon component co-exists in the atmospheric gas, such gas tends to cause lattice defect, as the gas tends to be solid solution in SiC crystal. Therefore, generally, an inert gas not containing such component is used. Among others, argon (Ar) gas is preferred. Though atmospheric pressure (1 atm) is sufficient as the gas pressure at this time to expect the effect, the effect improves if the pressure increases. The higher the gas pressure, the easier the dislocations move in the SiC crystal, and hence the easier it becomes to eliminate the defects in the crystal. For example, high effect is expected when the process is performed under the gas pressure of 1000 to several thousands atms, using a high pressure gas processing apparatus such as a hot isostatic press (HIP) apparatus. Preferably, the time of heat treatment of silicon carbide in the inert gas described above should preferably be at least 30 minutes. If the process temperature is lower than 1600° C. or the process time is shorter than 30 minutes, the effect of reducing defects by the process is not much expected. If the time exceeds three hours, the effect is saturated. Though the higher the process temperature, the higher the effect, when the temperature exceeds 2400° C., SiC would be sublimated, to be dissolved to Si and C, resulting in lower production yield.

In order to further reduce the amount of defects in SiC raw material powder, a possible method is to provide temperature gradient in the furnace so as to cause sublimation of SiC at a high temperature portion (for example, 3000° C.) and to cause re-deposition thereof at a low temperature portion (for example, 1800° C.). By such a method, it is possible to obtain powder almost free of any defect. The crystal particles of the powder obtained through this method have extremely high thermal conductivity. The method, however, sometimes inevitably results in lower production yield of the powder, as in the method (3) described above. In order to avoid this problem and to obtain SiC powder of higher purity, the present invention incorporates, as a preferable method, the step of preliminary acid treatment in which the powder is dipped in an acid such as hydrofluoric acid, nitric acid or hydrochloric acid, before the preliminary heat treatment. In this manner, it becomes possible to dissolve and remove oxygen, carbon and the cation impurity element mentioned above existing near the surfaces of the powder particles, that is, transition metal impurities such as iron (Fe), chromium (Cr), vanadium (V) and nickel (Ni), especially iron (Fe). The impurity, oxygen and carbon near the surface of SiC particles diffuse to the inside of SiC crystal particles at a high temperature, causing increase in point defects and stacking faults in the particles. Consequently, thermal diffussivity of SiC crystal particles decreases. The influence of the component containing iron (Fe) element is significant. Fe may exists in unbonding state or in the state of a compound such as an oxide, in the SiC particles. By selecting the silicon carbide powder containing few oxygen or cation impurity in advance or by additionally performing preliminary heat treatment or preliminary acid treatment on commercially available silicon carbide powder containing impurity, silicon carbide based composite material having higher thermal conductivity can be obtained than when the commercially available SiC powder is used as it is.

Generally, SiC is a material providing an n type semiconductor having excessive electrons or a p type semiconductor having excessive holes. Therefore, when the concentration of excessive electrons or holes (carriers) increase, phonons in the SiC are scattered, resulting in lower thermal conductivity. Generally manufactured SiC of 6H type crystal is of n type and green, with solid solution of nitrogen (N). The smaller the amount of N, the clearer the color of the crystal becomes. Here, by the mechanism of generating carriers, N substitute for the position of C (carbon) of SiC crystal, and a free electron (carrier) generates in accordance with the following expression (11).

$$C^{4-} \rightarrow N^{3-} + e^- \quad (11)$$

As cation impurity such as Al or Fe exists in solid solution in the actual crystal, such impurity substitutes for the Si position of SiC crystal, and a hole (carrier) is generated in accordance with the following expressions.

$$Si^{4+} \rightarrow Al^{3+} + p^+ \quad (12)$$

$$Si^{4+} \rightarrow Fe^{3+} + p^+ \quad (13)$$

Therefore, carrier concentration is determined by the amount of solid solution of cation ion impurity such as Fe or Al, or N. In common SiC powder, the larger the amount of N, the higher the carrier concentration. However, the larger the amount of cation impurity such as Fe or Al, the larger the number of holes which are bonded to free electrons, and therefore carrier concentration seemingly decreases. More specifically, in the SiC crystal having the same N concentration, the higher the cation impurity concentration, the lower the carrier concentration. Therefore, in order to improve thermal conductivity of SiC, it is necessary to reduce the amount of solid solution of such cation impurity or N into the crystal. The lower carrier concentration of the SiC powder used for the silicon carbide based composite material of the present invention, the better. Particularly, the carrier concentration of at most $5 \times 10^{19}$ cm$^{-3}$ is desired. The carrier concentration is measured in the following manner. Generally, the carrier concentration of a single crystal is measured by forming electrodes on upper and lower surfaces of a plate shaped sample, in accordance with CV method (method of measurement utilizing hole effect). However, electrodes cannot be formed on the powder, and therefore this method is not applicable. The carrier concentration of powder is measured by the Raman spectroscopic analysis. In this method, the crystal in the powder is excited by laser, and the degree of shifting of frequency of scattered spectrum (Raman scattering) is measured. The higher the carrier concentration, the larger the degree of shifting.

As described above, by using silicon carbide powder having few impurity or defects, a composite material of superior thermal conductivity can be obtained. Here, the silicon carbide based composite material having the thermal conductivity within the range corresponding to equation (4) of Al—SiC base and the range corresponding to the equation (8) of the Cu—SiC base can be obtained. In connection with the method of manufacturing in accordance with the aforementioned another aspect of the present invention, by preparing such SiC powder, a composite material having superior thermal conductivity can be obtained even when the common infiltration process, sintering process, hot press or casting process is employed, as compared when common commercially available silicon carbide material is used.

The amount of the impurity existing at the surface of SiC particles can be confirmed by acid extraction process. The process includes the following steps. The SiC powder is dipped for about two hours in a mixed acid solution containing nitric acid and hydrofluoric acid maintained at 100° C. so that the impurity existing on the surface of the powder is eluded, and thereafter, the amount of the elusion is determined by ICP emissions spectral analysis. When the amount of impurity existing inside the SiC particle is to be confirmed as well, the impurity is eluded by pressure acid decomposition process. Here, the SiC powder is dipped for about 40 hours in a mixed acid solution containing nitric acid and hydrofluoric acid kept at 190 to 230° C. Thus the impurity not only at the surface but also in the inside of SiC particles can be extracted, and the amount of the elusion is determined in the similar manner by ICP emission spectral analysis. The amount of stacking faults in the SiC particles can be confirmed by direct observation, using transmission electron microscope, of the object SiC particles. When the amount of impurity or the amount of stacking faults of the SiC particles in the composed silicon carbide based composite material are to be confirmed, first, the first component is separated and removed by acid, for example, and the remaining SiC particles are analyzed and evaluated through the similar process steps.

The raw material of the first component mainly consisting of aluminum or copper may be commercially available. It should be noted, however, that in order not to lower thermal conductivity of the fabricated composite material, the raw material should desirably have higher purity. Raw material having the purity of 99% or higher is desired. The raw material of the first component used in the present invention may be in the form of a mass, powder or any other shape. Generally, however, the raw material in the shape of powder is used, except when the infiltrating process or casting process is adapted in the manufacturing method in accordance with the aforementioned another aspect of the present invention. Impurity species existing in the raw material powder, especially the component containing transition metal element, especially 8a group element, solid solution of which in aluminum is likely, should be minimized. Therefore, when commercially available aluminum alloy powder is used, one containing smallest amount of such component providing the alloy should be selected. Further, in order to improve aluminum purity of the aluminum or the raw material powder of the aluminum alloy, powder prepared by physical or chemical process or molten metal atomizing process of the powder should be used, so as to improve purity of the commercially available powder.

As described above, in the present invention, the raw material containing as small an alloy component as possible should preferably be used as the first component, to improve thermal conductivity of the composite material. It should be noted, however, that sometimes the coefficient of thermal expansion must be suppressed in consideration of conformability with the peripheral member, even when the thermal conductivity is sacrificed to some extent. In such a case, a component having smaller coefficient of thermal expansion than the first component may be added to such an extent that does not much affect thermal conductivity. For the Al—SiC based material, for example, Al alloys containing Si may be used for the Al raw material. Here, the amount of Si not much affecting thermal conductivity is about 20 parts by weight for 100 parts by weight of Al.

As described above, for the raw material used in the present invention, SiC powder having highest possible purity and few defects should be used as the second component, and the raw material mainly consisting of aluminum or copper having high purity should be used as the first component. As to the method of mixing the raw materials, conventional method may be used provided that the purity of the raw material is not degraded, taking into consideration the shape and nature of the raw material. Further, the mixture should preferably be pelletized to granule so that the mixture becomes less bulky, in order to facilitate the operation of making compact the mixture. Any conventional method may be used to make the compact of the mixture.

The method of manufacturing the silicon carbide based composite material in accordance with the present invention encompasses the manufacturing method including the step of heat treatment in which the forged body obtained through the manufacturing method in accordance with the above described one aspect or the silicon carbide based composite material element obtained through the manufacturing method in accordance with the aforementioned another aspect is heated at a temperature Th which is lower than the melting point Tm of the first component mainly consisting of aluminum or copper. The method also encompasses the method incorporating the preferable implementation of the step of preparing the raw material containing the first and second components described above. The process atmosphere may be non-oxidizing atmosphere, and generally it is nitrogen atmosphere. By the heat treatment, lattice distortion existing in the forged body crystal of the porous composite material or existing in the element obtained through the manufacturing method in accordance with the aforementioned another aspect can be relaxed. The reason for this is that by the heating at a temperature Th lower than the melting point Tm of the first component, the component existing as solid solution in Al or Cu as the first component (for example, the component containing transition metal element of 8a group, for example, or Si in Al—SiC based material, and component containing transition metal element of 8a group, for example, in Cu—SiC based material) are discharged out from the crystal particles. Though the range of the resulting thermal conductivity does not exceed the upper limit defined by the equation (3) described above, the thermal conductivity of the forged composite material can further be improved. When the temperature Th of heat treatment exceeds the melting point Tm of Al or Cu, liquid phase of Al or Cu generates, and therefore the effect cannot be expected.

In either of the methods of manufacturing the two composite materials in accordance with the present invention, the temperature Th of the step of heat treatment should desirably satisfy the relation of Th>Tm−100. Re-heating within this temperature range enables reduction in the time of heat treatment. For example, at least one hour of heat treatment is sufficient for Al—SiC based material. When the time of heat treatment is extended as described above, the distortion within the base particles can be relaxed, further enhancing thermal conductivity. When there is the relation of Th≦Tm−100, longer time of heat treatment is necessary.

Though it depends on the composition or the level of thermal conductivity of the composite material before re-heating, the method of the present invention incorporating re-heating improves the thermal conductivity at the level of about 150 to 200 W/m·K of the Al based material, for example, to be not lower than the lower limit level defined by the equation (2) (that is, the lower limit line represented by the thick solid line in FIG. 1). Further, the thermal conductivity at the level of about 200 to 250 W/m·K of the Cu based material can be improved to the level of the lower limit defined by the equation (6) (that is, the thick solid line of FIG. 2) or higher. The present invention will be described with reference to specific examples.

EXAMPLE 1

SiC raw material powder samples subjected to various preliminary processes as specified in Table 1, Al based raw materials listed in Table 2 and Cu based raw materials listed in Table 3 were prepared as raw materials. Carrier concentrations of SiC raw material powder samples confirmed by Raman spectroscope was $1 \times 10^{17}/cm^3$ in sample No. S1 having 6H type structure, and $1 \times 10^{18}/cm^3$ in sample No. S12 having 4H structure. The samples of which preliminary process is denoted as "none" in Table 1 were not subjected to any preliminary process. The preliminary acid treatment was performed by the procedure in which the powder was dipped in the acid solution of such concentration and temperature as recited in the table for the time period as recited in the table, washed by pure water, the steps of dipping and washing was repeated three times, and dried by hot air. Namely, the raw material sample S2, for example, was obtained by dipping SiC powder of raw material S1 in a hydrofluoric acid solution having the concentration of 10% at a room temperature for 10 minutes, washed by pure water, and the series of operations was repeated three times, and thereafter the powder was dehydrated and dried by hot air. The preliminary heat treatment was performed by inserting the powder in a case of silicon carbide, set in a furnace of which heater was formed of tungsten, and kept in an argon gas atmosphere under the gas pressure as recited in the table at the temperature as recited in the table, for one hour. The impurity amount of respective SiC powder samples recited in the table were measured by dissolving and extracting impurity containing component from the powder samples by pressure acid decomposition process under the condition as described above and by analyzing the extract by IPC emission spectral analysis. The amount represents the amount existing in overall particles, that is, not only on the surfaces but also at the inside of the particles. Though the amount of cation element (transition metal element) referred to in the present invention other than Fe (iron) is not shown in Table 1, the amount of each element was at most 500 ppm in any of the sample raw materials. The amount of C (carbon) was at most 500 ppm in any sample raw materials.

TABLE 2

| No | average grain diameter (μm) | Al purity (%) | alloy component · amount (value without unit is in ppm) | remarks |
|---|---|---|---|---|
| A11 | 25 | about 99.5 | Fe < 300, Mg < 300, Si < 300 | high purity Al, powder |
| A12 | — | about 99.5 | Fe < 300, Mg < 300, Si < 300 | same as above, plate |
| A21 | 30 | about 99.0 | Fe < 400, Mg 10 wt %, Si < 200 | Mg based Al alloy, powder |
| A22 | — | about 99.0 | Fe < 400, Mg 10 wt %, Si < 200 | same as above, plate |
| A31 | 100 | about 90.0 | Fe < 300, Mg < 400, Si 10 wt % | Si based Al alloy, powder |
| A32 | — | about 90.0 | Fe < 300, Mg < 400, Si 10 wt % | same as above, plate |

TABLE 1

| No. | preliminary treatment acid treatment | preliminary treatment heat treatment | crystal type | average grain diameter (μm) | amount of impurity (ppm) Fe | Al | oxygen |
|---|---|---|---|---|---|---|---|
| S1 | none | none | α, 6H | 50 | 310 | 220 | 14900 |
| S2 | S1 powder dipped in room temp., 10% HF solution for 10 min | " | " | " | 100 | 80 | 1000 |
| S3 | same as above, for 20 min. | " | " | " | 90 | 60 | 980 |
| S4 | same as above, for 25 min. | " | " | " | 50 | 40 | 510 |
| S5 | same as above, for 30 min. | " | " | " | 30 | 20 | 290 |
| S6 | S1 powder dipped in 170° C., 10% HF solution for 40 min. | " | " | " | 3 | 3 | 220 |
| S7 | none | heated to 1500° C., 1 atm in Ar | " | " | 160 | 100 | 1000 |
| S8 | none | same as above, 1600° C. | " | " | 100 | 100 | 950 |
| S9 | none | same as above, 2000° C. | " | " | 70 | 50 | 350 |
| S10 | none | same as above, 2400° C. | " | " | 60 | 30 | 290 |
| S11 | S1 powder dipped in room temp., 10% HF solution for 30 min. | same as above, 1600° C. | " | " | 30 | 20 | 250 |
| S12 | none | none | α, 4H | " | 300 | 200 | 16480 |
| S13 | S1 powder dipped in room temp., 10% HF solution for 30 min. | " | " | " | 30 | 20 | 350 |
| S14 | S1 powder dipped in room temp., 10% HF solution for 30 min. | heated to 1600° C., 1 atm in Ar | " | " | 20 | 15 | 250 |
| S15 | S1 powder dipped in room temp., 10% HF solution of 30 min. | heated to 1600° C., 1000 atm in Ar | " | " | 15 | 10 | 100 |

TABLE 3

| No | average grain diameter (μm) | Cu purity (%) | alloy component · amount (value without unit is in ppm) | remarks |
|---|---|---|---|---|
| C11 | 25 | about 99.5 | Fe < 500, Mg < 500, Si < 600 | high purity Cu, powder |
| C12 | — | about 99.5 | Fe < 500, Mg < 500, Si < 600 | same as above, plate |
| C21 | 100 | about 90.0 | Fe < 300, Mg < 400, Si 10 wt % | Si based Cu alloy, powder |
| C22 | — | about 90.0 | Fe < 300, Mg < 400, Si 10 wt % | same as above, plate |
| C31 | 30 | about 99.0 | Fe < 400, Mg 10 wt %, Si < 500, | Mg based Cu alloy, powder |
| C32 | — | about 99.0 | Fe < 400, Mg 10 wt %, Si < 500, | same as above, plate |

Respective SiC raw material powder samples as recited in Table 1 were selected as the second component, sample No. A11 of Al based raw material powder recited in Table 2 or sample No. C11 of Cu based raw material powder as recited in Table 3 was selected as the first component, and 30 samples of the silicon carbide based composite material containing 50 wt % of SiC were fabricated for each of the respective combinations, in accordance with the method of manufacturing in accordance with the above described one aspect of the present invention. Table 4 shows in the column "raw material" 30 combinations of the raw materials fabricated.

First, respective SiC raw material powder samples recited in Table 1 and the raw material powder of sample No. A11 or C11 were weighted such that each SiC raw material powder sample occupied 50 wt % and the A11 or C11 raw material powder occupied the remaining 50 wt %, 3 wt % of paraffin was added as binder, and the materials were mixed for 3 hours in ethanol. The resulting slurry was spray-dried to provide pelletized powder. The resulting pelletized powder was compacted to have the diameter of 100 mm and thickness of 10 mm by dry powder compact press with the pressure of 7 ton/cm$^2$, and thereafter the binder was removed in ambient atmosphere at 400° C., to provide compact bodies. Respective compact bodies were set in a heating furnace of electromagnetic induction heating type, and heated in ambient atmosphere. The conditions for heating were as follows: the rate of temperature increase was 600° C./min, the temperature to be held was set to 670° C. for Al—SiC based materials and 1090° C. for Cu—SiC based materials, and the time of holding was 10 seconds. Further, compact bodies prepared by the same combination of raw materials as sample Nos. 5 and 20 of Table 4 were put in a batch type furnace having a nichrome wire heater heated in advance, and kept at the same temperature as sample Nos. 5 and 20 with the temperature increase rate of 100° C./min, and held for 30 minutes, so that the uniform heating was attained. Thereafter, the compact bodies were immediately put in forging molds heated separately in advance, and forged with the pressure of 9 ton/cm$^2$. Molds of die steel were used both for Al—SiC based materials and Cu—SiC based materials, and the heating temperature of the molds was 450° C. The final thickness of the forged bodies was, in any sample, about 10 mm. Thereafter, the samples were subjected to grinding process finish.

TABLE 4

| | raw material | | | | coefficient | | | | | |
| | 2nd com- | 1st com- | porosity | density | thermal conductivity | of thermal expansion | amount of impurity (ppm) | | | lattice constant |
| No. | ponent | ponent | (%) | (%) | (W/m · K) | (× 10$^{-6}$/° C.) | Fe | Al | oxygen | (Å) |
|---|---|---|---|---|---|---|---|---|---|---|
| 1 | S1 | A11 | 0 | 100 | 180 | 11.0 | 310 | 220 | 14920 | 4.0562 |
| 2 | S2 | " | " | " | 284 | " | 100 | 80 | 1000 | 4.0510 |
| 3 | S3 | " | " | " | 286 | " | 90 | 60 | 990 | 4.0509 |
| 4 | S4 | " | " | " | 288 | " | 50 | 40 | 520 | 4.0502 |
| 5 | S5 | " | " | " | 299 | " | 30 | 20 | 295 | 4.0500 |
| 6 | S6 | " | " | " | 320 | " | 3 | 3 | 240 | 4.0496 |
| 7 | S7 | " | " | " | 230 | " | 160 | 100 | 1010 | 4.0535 |
| 8 | S8 | " | " | " | 283 | " | 100 | 100 | 980 | 4.0509 |
| 9 | S9 | " | " | " | 289 | " | 70 | 50 | 360 | 4.0500 |
| 10 | S10 | " | " | " | 295 | " | 60 | 30 | 295 | 4.0510 |
| 11 | S11 | " | " | " | 310 | " | 30 | 20 | 260 | 4.0498 |
| 12 | S12 | " | " | " | 175 | " | 300 | 200 | 16500 | 4.0565 |
| 13 | S13 | " | " | " | 299 | " | 30 | 20 | 360 | 4.0503 |
| 14 | S14 | " | " | " | 312 | " | 20 | 15 | 260 | 4.0496 |
| 15 | S15 | " | " | " | 340 | " | 15 | 10 | 110 | 4.0495 |
| 16 | S1 | C11 | " | " | 210 | 7.9 | 310 | 220 | 14940 | — |
| 17 | S2 | " | " | " | 350 | " | 100 | 80 | 1000 | — |
| 18 | S3 | " | " | " | 353 | " | 90 | 60 | 990 | — |
| 19 | S4 | " | " | " | 355 | " | 50 | 40 | 530 | — |
| 20 | S5 | " | " | " | 362 | " | 30 | 20 | 300 | — |
| 21 | S6 | " | " | " | 385 | " | 3 | 3 | 250 | — |
| 22 | S7 | " | " | " | 330 | " | 160 | 100 | 1020 | — |
| 23 | S8 | " | " | " | 350 | " | 100 | 100 | 990 | — |
| 24 | S9 | " | " | " | 357 | " | 70 | 50 | 370 | — |
| 25 | S10 | " | " | " | 360 | " | 60 | 30 | 300 | — |
| 26 | S11 | " | " | " | 375 | " | 30 | 20 | 270 | — |

TABLE 4-continued

| | raw material | | | | thermal conductivity | coefficient of thermal expansion | amount of impurity (ppm) | | | lattice constant |
|---|---|---|---|---|---|---|---|---|---|---|
| | 2nd com- | 1st com- | porosity | density | | | | | | |
| No. | ponent | ponent | (%) | (%) | (W/m · K) | (× 10⁻⁶/° C.) | Fe | Al | oxygen | (Å) |
| 27 | S12 | " | " | " | 200 | " | 300 | 200 | 16520 | — |
| 28 | S13 | " | " | " | 363 | " | 30 | 20 | 370 | — |
| 29 | S14 | " | " | " | 379 | " | 20 | 15 | 270 | — |
| 30 | S15 | " | " | " | 400 | " | 15 | 10 | 120 | — |

From apparent densities calculated based on the weight and volume actually measured of respective forged body samples and the theoretical densities calculated based on the densities of main components and the composition ratio in accordance with the rule of mixture, porosities and relative densities (in the following, simply indicated as "density" with the unit of % in the tables) were calculated, thermal conductivity was calculated by laser flash method, the coefficients of thermal expansion were calculated by differential transformer type thermal expansion measuring apparatus, and amounts of impurities in SiC crystal particles were calculated by the combination of pressure acid decomposition process and emission spectral analysis, respectively. For the Al—SiC based samples, plane-to-plane distance of Al (331) plane was measured by X-ray diffraction, and lattice constant of Al was calculated based on the measured values. The results are as shown in Table 4. The samples prepared by forging compact bodies heated by the nichrome wire heater furnace described above had the thermal conductivity of 283 W/m·K in samples corresponding to sample No. 5 and 350 W/m·Km in samples corresponding to sample No. 20. Namely, thermal conductivities were lower than thermal conductivities of the samples heated by electromagnetic induction heating method, shown in Table 4. The reason for this may be that the amount of oxygen in SiC particles was increased to 1000 ppm because of long heating time.

Using SiC raw material powder S1, with the atmosphere gas for preliminary heat treatment changed to a gas containing nitrogen or carbon separately, forged bodies were fabricated by the same composition.combination with the first component and through similar compacting and forging procedures as shown in Table 4. The thermal conductivity of thus provided forged bodies were as follows. The thermal conductivity of Al—SiC based material with preliminary acid treatment was about the same as that of sample No. 7 of Table 4, and thermal conductivity of the Cu—SiC bases material with preliminary acid treatment was about the same as that of Sample No. 22 of Table 4, while that of Al—SiC based material without acid treatment was about 210 W/m·K and that of Cu—SiC based material without acid treatment was about 250 W/m·K. Therefore, it was found that the effect of preliminary heat treatment was suppressed. Further, using SiC raw material powder samples of different carrier concentration levels, influence of the carrier concentrations on thermal conductivity of resulting composite materials were confirmed. As SiC raw material powder, powder S2 having average grain diameter of 50 μm and 6 H type crystal particles with preliminary acid treatment, and mixed powder S16 prepared by mixing 30 wt % of powder S2 and 70 wt % of powder having the same average grain diameter and 15R type crystal particles with preliminary acid treatment were prepared. Carrier concentration of the former powder was $1\times10^{17}/cm^3$, and that of latter was $1\times10^{20}/cm^3$. Using these two powder samples, forged body samples of Al—SiC based and Cu—SiC based materials of the same shape were fabricated through the similar process steps as described above. Thermal conductivities of the samples were confirmed in the similar manner as described above, which were 284 W/m·K for the former one, and 230 W/m·K for the latter.

From the foregoing, it is understood that (1) by the method of manufacturing in accordance with the above described one aspect of the present invention in which mixed compact body of the first component and the SiC raw material powder is forged, when the SiC raw material powder is pre-processed (subjected to preliminary acid treatment or preliminary heat treatment), impurity in the SiC particles can be reduced in comparison to when not subjected to such pre-processing, and as a result, a material having high thermal conductivity can be obtained. The effect is particularly significant when the preliminary acid treatment is performed followed by preliminary heat treatment, or when preliminary heating is performed under high gas pressure. Possible reasons may be that because of reduced amount of impurity in the SiC particles and higher density attained quickly by forging, defects or distortion in the particles can be suppressed, and a material in which main components have high adhesion can be obtained. Further, it is understood that (2) as means for heating before forging, means allowing uniform heating rapidly and allowing increase/decrease of temperature in a short period of time are preferable to improve thermal conductivity of the composite material in accordance with the present invention and to improve productivity.

EXAMPLE 2

Using SiC raw material powder S8 of Table 1 as the second component, and Al based raw material powder A11 of Table 2 or raw material powder C11 of Table 3 as the first component, composite materials containing 10, 20, 30, 50, 70 and 80 wt % of SiC were fabricated (Sample Nos. 31–40) through the same process steps as in Example 1 above (in accordance with the manufacturing method of one aspect of the present invention, with heating before forging performed by electromagnetic induction heating as in Example 1). Further, Al—SiC based compacts containing 80 wt % of SiC were fabricated with the heating temperature T before forging and the forging pressure P being varied (Sample Nos. 41–49). The temperature T and pressure P for respective samples were 670° C. (slightly higher than the melting point of 660° C. of Al based raw material powder of pure Al or Sample No. A11 as the second component) and 0.8 ton/cm² for Sample No. 41, 670° C. and 1 ton/cm² for Sample No. 42, 670° C. and 4 ton/cm² for Sample No. 43, 670° C. and 5 ton/cm² for Sample No. 44, 670° C. and 9 ton/cm² for Sample No. 45, 670° C. and 10 ton/cm² for Sample No. 46, 620° C. and 9 ton/cm² for Sample No. 47, 770° C. and 9 ton/cm² for Sample No. 48, and 870° C. and 9 ton/cm² for Sample No. 49. More specifically, for the Sample Nos. 41 to 46, pressure P was varied, while for the Sample Nos. 47 to 49, the temperature T was varied. These forged body samples were evaluated in the similar manner as in Example 1, the results of which are as shown in Table 5. Effects dependent on the forging conditions were also confirmed on Cu—SiC based compacts containing 80 wt % of SiC, and a tendency similar to that of Al—SiC based material was observed.

From the foregoing, it is understood that (1) by the manufacturing method in accordance with one aspect of the present invention, by changing the amount of SiC, a material having thermal conductivity and coefficient of thermal expansion in accordance with the law of mixture can be obtained, and that (2) even when the amount of SiC is large (80 wt %), a material having relative density of higher than 99% can be obtained by the forging pressure of at least 1 ton/cm², near the melting point of the first component. When the forging pressure exceeds 10 ton/cm² and the heating temperature exceeds the melting point of the first component, the effect of improving density by forging is saturated.

TABLE 5

| | raw material | | | | | coefficient | | | | |
| --- | --- | --- | --- | --- | --- | --- | --- | --- | --- | --- |
| | SiC amount | 1st com- | porosity | density | thermal conductivity | of thermal expansion | amount of impurity (ppm) | | | lattice constant |
| No. | (wt %) | ponent | (%) | (%) | (W/m · K) | (× $10^{-6}$/° C.) | Fe | Al | oxygen | (Å) |
| 31 | 10 | Al base | 0 | 100 | 250 | 20.0 | 100 | 100 | 980 | 4.0505 |
| 32 | 20 | Al base | " | " | 273 | 18.3 | " | " | " | 4.0508 |
| 33 | 50 | Al base | " | " | 283 | 11.0 | " | " | " | 4.0509 |
| 34 | 70 | Al base | " | " | 289 | 7.6 | " | " | " | 4.0510 |
| 35 | 80 | Al base | " | " | 292 | 7.4 | " | " | " | 4.0510 |
| 36 | 10 | Cu base | " | " | 396 | 13.0 | 100 | 100 | 990 | — |
| 37 | 20 | Cu base | " | " | 392 | 10.8 | " | " | " | — |
| 38 | 50 | Cu base | " | " | 350 | 7.9 | " | " | " | — |
| 39 | 70 | Cu base | " | " | 326 | 6.8 | " | " | " | — |
| 40 | 80 | Cu base | " | " | 313 | 5.0 | " | " | " | — |
| 41 | 80 | Al base | 1.0 | 99.0 | 289 | 7.4 | " | " | " | 4.0510 |
| 42 | 80 | Al base | 0.3 | 99.7 | 290 | " | " | " | " | " |
| 43 | 80 | Al base | 0.2 | 99.8 | 291 | " | " | " | " | " |
| 44 | 80 | Al base | 0.1 | 99.9 | 292 | " | " | " | " | " |
| 45 | 80 | Al base | 0 | 100 | 292 | " | " | " | " | " |
| 46 | 80 | Al base | 0 | 100 | 292 | " | " | " | " | " |
| 47 | 80 | Al base | 0.3 | 99.7 | 290 | " | " | " | " | " |
| 48 | 80 | Al base | 0 | 100 | 292 | " | " | " | " | " |
| 49 | 80 | Al base | 0 | 100 | 292 | " | " | " | " | " |

EXAMPLE 3

Using two SiC raw material powder samples S1 and S2 of Table 1 as the second component, Al—SiC based and Cu—SiC based composite materials containing 50 wt % of SiC were fabricated by infiltration process, sintering process, hot press and forging process, that is, by the manufacturing method in accordance with another aspect of the present invention. Only for the materials fabricated by infiltration process, plate materials of Sample Nos. A12, A22, S32, C12, C22 and C32 of Table 2 were used as the first component to be infiltrated. For other processes, powder samples of Sample Nos. A21, A31, C21 and C31 were used as the raw materials of the first component. The combinations of starting raw materials of respective samples are as shown in the column of "raw material" of Table 6.

The samples fabricated by infiltration process were prepared in the following manner. The binder similar to that of Example 1 was added to the aforementioned two SiC raw material powder samples, compacted to the same shape, the binder was removed to provide porous compacts, and the compacts were placed on plate materials of the first component described above. In nitrogen air flow, Al—SiC based compacts were heated at 750° C. and Cu—SiC based compacts were heated at 1200° C., respectively, for 2 hours, so as to cause spontaneous infiltration of the first component (Sample Nos. 50–59). As to the samples fabricated by sintering process, similar to Example 1, mixing and compacting were performed in the similar manner as in Example 1 using the combinations of two SiC raw material powder samples (Nos. S1 and S2) and two first component raw material powder samples (Nos. A3 and C3). Thereafter, in a cooled to room temperature (Sample Nos. 66, 67). The samples obtained through these methods were finished and evaluated in the similar manner as in Example 1. The results are as shown in Table 6.

From the result shown in the table, it can be understood that (1) in accordance with the manufacturing method of the aforementioned another aspect of the present invention, when SiC raw material powder No. S1 without preliminary treatment of acid dipping or heating is used and when powder No. S2, which is the same powder No. S1 with preliminary heat treatment, is used, the latter exhibited considerably higher thermal conductivity. Further, it is understood that (2) in accordance with the manufacturing method of the aforementioned another aspect of the present invention incorporating an infiltration process or sintering process, when the sample using the first component containing an alloy component which exists in the form of solid solution in the main component Al or Cu and samples using highly pure Al or Cu as the main component are compared, the former provides higher density, as wettability with SiC is improved. Thermal conductivity however, is lower than that of the latter.

TABLE 6

| | raw material | | | | | coefficient | | | | |
| | SiC amount | 1st com- | porosity | density | thermal conductivity | of thermal expansion | amount of impurity (ppm) | | | lattice constant |
| No. | (wt %) | ponent | (%) | (%) | (W/m · K) | (× 10⁻⁶/° C.) | Fe | Al | oxygen | (Å) |
|---|---|---|---|---|---|---|---|---|---|---|
| 50 | S1 | A12 | 1 | 99 | 180 | 11.0 | 310 | 220 | 14900 | 4.0565 |
| 51 | " | A22 | 0 | 100 | 160 | " | " | " | " | 4.0558 |
| 52 | " | A32 | 0 | 100 | 150 | " | " | " | " | 4.0560 |
| 53 | " | C12 | 1 | 99 | 210 | 7.9 | " | " | " | — |
| 54 | " | C22 | 0 | 100 | 180 | " | " | " | " | — |
| 55 | " | C32 | 0 | 100 | 170 | " | " | " | " | — |
| 56 | S2 | A22 | 0 | 100 | 210 | 11.0 | 100 | 80 | 1000 | 4.0540 |
| 57 | " | A32 | 0 | 100 | 205 | " | " | " | " | 4.0550 |
| 58 | " | C22 | 0 | 100 | 260 | 7.9 | " | " | " | — |
| 59 | " | C32 | 0 | 100 | 250 | " | " | " | " | — |
| 60 | S1 | A31 | 0 | 100 | 158 | 11.0 | 310 | 220 | 14900 | 4.0560 |
| 61 | " | C31 | 0 | 100 | 150 | 7.9 | " | " | " | — |
| 62 | S2 | A31 | 0 | 100 | 200 | 11.0 | 100 | 80 | 1000 | 4.0550 |
| 63 | " | C21 | 0 | 100 | 260 | 7.9 | " | " | " | — |
| 64 | S1 | A31 | 0 | 100 | 162 | 11.0 | 310 | 220 | 14900 | 4.0557 |
| 65 | " | C31 | 0 | 100 | 205 | 7.9 | " | " | " | — |
| 66 | " | A31 | 0 | 100 | 155 | 11.0 | " | " | " | 4.0561 |
| 67 | " | C31 | 0 | 100 | 195 | 7.9 | " | " | " | — | nitrogen flow, Al—SiC based compacts were heated at 670° C. and Cu—SiC based compacts were heated at 1200° C., respectively, for two hours and sintered (Sample Nos. 60–63). As to the hot press, compact elements of Sample Nos. 60 and 61 provided by the sintering process described above were put in molds formed of silicon carbide based ceramics, and hot pressed in an argon atmosphere with the pressure of 0.5 ton/cm² at 660° C. (Sample Nos. 64, 65). As to the samples fabricated by forging process, molds formed of graphite were pre-heated, powder samples of the first component were put therein, and Al— SiC based samples were heated at 750° C. and Cu—SiC based samples were heated at 1200° C., respectively, for one hour and melt. Thereafter, respective SiC raw material powder samples were added to the melts, mixed for one hour and gradually

EXAMPLE 4

Samples of the numbers as recited in the column of "material" of Table 7 obtained in the manner as described in Examples 1 to 3 were heat-treated for 3 hours at respective temperatures as recited in the column of "heat treatment temperature" in the table, in nitrogen flow. The results are also shown in the table. The temperatures in the column of "melting point" of the table represent temperatures of respective material elements at which liquid phase of the first component starts to generate, confirmed by differential thermal analysis (DTA). Thermal conductivities after heat treatment and lattice constants of Al—SiC based samples were calculated in the similar manner as in Example 1, and the values thereof are also shown in the table. Though porosity, relative density, coefficient of thermal expansion and the amount of impurity in the SiC particles after heat treatment are not shown in the table, these were approximately at the same levels as the starting materials. From the results shown in the table, it can be understood that when the material elements fabricated by the manufacturing method of the two aspects of the present invention are heat-treated at a temperature lower than the melting point of the metal of the first component of respective material elements, thermal conductivity can be improved. The reason for this is considered that by such heat treatment, part of the alloy component existing in the form of solid solution in the crystal phase of the first component is forced out from the phase, so that lattice distortion of the phase itself is reduced, and the component comes to be closer to the pure main component having high thermal conductivity. It is supported by the fact that lattice constant of Al—SiC based sample was shifted to the side of pure Al from that of the starting material. Further, it can be understood that the preferable range of process temperature Th should be lower than the melting point Tm of the first component and exceeding Tm−100.

TABLE 7

| No. | material | melting point (° C.) | heat treatment temp. (° C.) | thermal conductivity (W/m · K) | lattice constant (Å) |
|---|---|---|---|---|---|
| 68 | 1 | 660 | 660 | 180 | 4.0562 |
| 69 | 1 | 660 | 650 | 200 | 4.0550 |
| 70 | 1 | 660 | 580 | 195 | 4.0553 |
| 71 | 1 | 660 | 550 | 190 | 4.0558 |
| 72 | 2 | 660 | 580 | 300 | 4.0500 |
| 73 | 16 | 1083 | 1083 | 210 | — |
| 74 | 16 | 1083 | 1060 | 230 | — |
| 75 | 16 | 1083 | 990 | 225 | — |
| 76 | 16 | 1083 | 980 | 220 | — |
| 77 | 17 | 1083 | 1060 | 380 | — |
| 78 | 32 | 660 | 580 | 300 | 4.0500 |
| 79 | 37 | 660 | 580 | 398 | — |
| 80 | 51 | 600 | 550 | 200 | 4.0552 |
| 81 | 54 | 830 | 780 | 220 | — |
| 82 | 56 | 600 | 550 | 240 | 4.0531 |
| 83 | 58 | 830 | 780 | 310 | — |
| 84 | 60 | 580 | 530 | 198 | 4.0552 |
| 85 | 63 | 830 | 780 | 310 | — |
| 86 | 64 | 580 | 530 | 203 | 4.0552 |
| 87 | 66 | 580 | 530 | 196 | 4.0553 |
| 88 | 67 | 720 | 670 | 230 | — |

EXAMPLE 5

Figure 3:
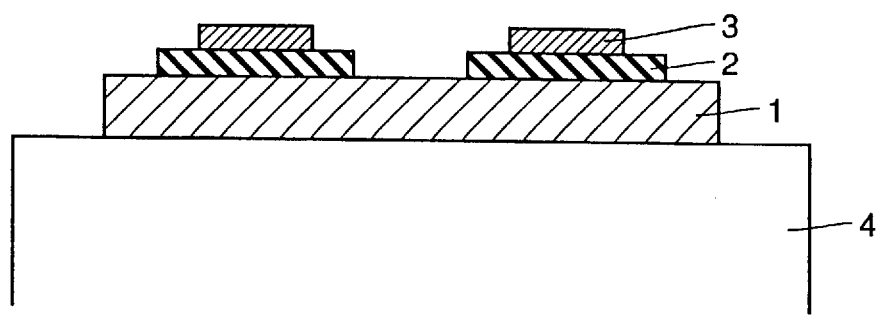
FIG. 3 is a schematic illustration of a semiconductor device (power module) using the material of the present invention as a substrate.

For each of the silicon carbide based composite materials obtained through the methods of Sample Nos. 1, 5, 6, 10, 16, 20, 21, 34, 39, 50, 51, 53, 60, 63, 66, 67, 72, 77, 80 and 85 of the above described Examples, fifty samples were finished as base materials each having the length of 200 mm, width of 200 mm and thickness of 3 mm, respectively. These samples were mounted as heat spreaders on such a power module as schematically shown in FIG. 3, and heat cycle test was performed. The heat cycle test included the step of mounting. Referring to FIG. 3, the second heat spreader 1 is formed of the composite material of the present invention. An electrically insulating first substrate 2 formed of ceramics is placed on the second substrate 1, and (though not shown), a copper circuit is formed on its upper surface. An Si semiconductor element 3 is formed on the first substrate 2. A heat radiating structure 4 is placed below the second heat spreader 1. Though the jacket is a water cooled jacket in the present example, air cooled fin or the like may be used. Interconnections and the like in the periphery of the semiconductor element are not shown in the figure. In the present example, a module was used in which six Si semiconductor elements are mounted with the first ceramics substrate interposed.

Before mounting, as it is not possible to solder the first substrate directly on the second substrate, an electroless nickel plating having the average thickness of 5 $\mu$m and an electrolytic nickel plating having average thickness of 5 $\mu$m were formed in advance on the main surface of the second substrate. On four samples of respective materials, copper wire having the diameter of 1 mm was attached in a direction vertical to the plating surface, by hemispherical Ag—Sn base solder having the diameter of 5 mm, on nickel plating. The substrate body of the samples were fixed on a jig, the copper wire was gripped and pulled in a direction vertical to the plating surface, so as to confirm adhesion strength of the plating with the substrate. The plating was not peeled off even when pulled with the pulling force of not lower than 1 kg/mm$^2$ from any of the substrates. Ten samples were extracted from remaining samples with the plating formed, and subjected to heat cycle test in which a cycle of keeping the samples at −60° C. for 30 minutes and 150° C. for 30 minutes was repeated 1000 times, and adhesion strength was confirmed in the similar manner after the test. Adhesion of plating satisfying the aforementioned level was confirmed in every samples. From the foregoing, it was found that the adhesion of plating with the substrates formed of the composite materials in accordance with the present invention was satisfactory for practical use with no problem.

Thereafter, as the first substrate formed of ceramics to be mounted on the second substrate, 18 first substrates with copper circuit formed thereon were prepared by using substrate A of aluminum nitride ceramics having thermal conductivity of 150 W/m·K, coefficient of thermal expansion of 4.5×10$^{-6}$/° C. and three point bending strength of 450 Mpa, and 18 first substrates with copper circuit formed thereon were prepared by using substrate B formed of silicon carbide ceramics having thermal conductivity of 120 W/m·K, coefficient of thermal expansion of 3.7×10$^{-6}$/° C. and three point bending strength of 1300 MPa. These substrates each had the length of 90 mm, width of 60 mm and the thickness of 1 mm. These substrates were arranged in 2 rows×3 columns at an equal distance on a main surface of the second substrate of 200 mm square, and on that surface of the second substrate on which nickel plating was formed, the first substrates were fixed by Ag—Sn based solder. Thereafter, the rear surface of the second substrate of the assembly and a water cooled jacket were fixed by bolts, with a silicon oil compound applied and interposed on the contact surface. Fixing holes of the first substrate in this case were formed by providing small holes at four corners in advance, that is, in a stage of material, and irradiating the holes with carbon oxide laser to enlarge the diameter to 3 mm. This process could be performed with high precision at high speed than when other ceramics material, Cu—W or Cu—Mo was the object. This tendency was more apparent when the thermal conductivity increased.

Among the samples, fifteen samples of which first substrates was substrate A and fifteen samples of which first substrate was substrate B were selected and subjected to heat cycle test of 3000 cycles under the same cycle condition as described above, and variation in module outputs at every 100 cycles was studied. Decrease in output was not observed in any of the modules up to 1000 cycles, which cycle number represented practically usable condition. It was observed, however, after 1100 cycles, that is, larger than the practical 1000 cycles, module outputs degraded slightly because of the heat cycle in those samples in which Sample Nos. 1, 50, 51, 53, 60, 66 and 80 having the coefficients of thermal expansion not lower than $10 \times 10^{-6}/°$ C. and thermal conductivities of not higher than 250 W/m·K were used as the second substrate. Of fifteen modules, of the modules in which Sample Nos. 1, 50, 51, 60 and 66 having thermal conductivities not higher than 180 W/m·K were used, module output from one module was slightly degraded after completion of 1100 cycles in one sample. In the sample which had the output degraded, generation of fine cracks were observed on the first substrate side of the solder bonded interface between the first and second substrates. Among fifteen modules in which Sample No. 56 having the coefficient of thermal expansion of $11.0 \times 10^{-6}/°$ C. and thermal conductivity of 210 W/m·K and Sample No. 53 having the coefficient of thermal expansion of $7.9 \times 10^{-6}/°$ C. and thermal conductivity of 150 W/m·K were used, slight decrease in output resulting from the same cause was observed in one module, after the completion of 2000 cycles. Other than these modules, such degradation was not observed until after completion of 3000 cycles.

From the results described above, it can be understood that the power modules using the first substrate formed of the silicon carbide based composite material in accordance with the present invention are of satisfactory level without any problem for practical use. Particularly, those in which the material having thermal conductivity of not lower than 250 W/m·K were used as the first substrate can be used as a substrate for a largest scale modules as described above, even under severe heat cycle condition.

The material in accordance with the present invention was mounted and evaluated as a heat spreader for a device having semiconductor elements mounted thereon, for example, a heat spreader for a high capacity personal computer having lower output and lower heat (cycle) load as compared with the modules of the type described above, and reliability and practical performance were satisfactory Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A silicon carbide based composite material including a metal mainly consisting of aluminum or copper and particles mainly consisting of silicon carbide, wherein said particles have a content of an iron element and a content of an aluminum element that are each not higher than 0.01 wt %.

2. The silicon carbide based composite material according to claim 1, wherein said content of said iron element and said content of said aluminum element in said particles are each not higher than 0.005 wt %.

3. The silicon carbide based composite material according to claim 1, wherein said metal is a metal mainly consisting of aluminum, and when content of said silicon carbide is represented as x wt % and thermal conductivity is represented as y W/m·K, x and y satisfy the relation of $y \geq 0.214x + 173$ (where $10 \leq x \leq 80$).

4. The silicon carbide based composite material according to claim 3, wherein said x and y satisfy the relation of $2.410x + 226 \geq y \geq 0.286x + 180$ (where $10 \leq x \leq 80$).

5. The silicon carbide based composite material according to claim 3, wherein said x and y satisfy the relation of $2.410x + 226 \geq y \geq 0.250x + 270$ (where $20 \leq x \leq 80$).

6. The silicon carbide based composite material according to claim 3, wherein said x and y satisfy the relation of $2.410x + 226 \geq y \geq 300$ (where $30 \leq x \leq 80$).

7. The silicon carbide based composite material according to claim 3, wherein said aluminum in said metal has a lattice constant of at most 4.053 Å.

8. The silicon carbide based composite material according to claim 1, wherein said metal is a metal mainly consisting of copper, and when content of said silicon carbide is represented as x wt % and thermal conductivity is represented as y W/m·K, x and y satisfy the relation of $y \geq -0.50x + 245$ (where $10 \leq x \leq 80$).

9. The silicon carbide based composite material according to claim 8, wherein said x and y satisfy the relation of $0.333x + 393 \geq y \geq -0.5x + 250$ (where $10 \leq x \leq 80$).

10. The silicon carbide based composite material according to claim 8, wherein said x and y satisfy the relation of $0.333x + 393 \geq y \geq -1.333x + 417$ (where $20 \leq x \leq -80$).

11. The silicon carbide based composite material according to claim 8, wherein said x and y satisfy the relation of $0.333x + 393 \geq y \geq -1.1x + 418$ (where $20 \leq x \leq 80$).

12. The silicon carbide based composite material according to claim 1, wherein said silicon carbide includes silicon carbide having 6H type crystal structure.

13. A semiconductor device including the silicon carbide based composite material in accordance with claim 1.

14. A method of manufacturing a silicon carbide based composite material including a metal mainly consisting of aluminum or copper and particles mainly consisting of silicon carbide, comprising the steps of:

preparing a raw material including a metal mainly consisting of aluminum or copper and a powder mainly consisting of silicon carbide;

mixing said raw material such that a content of said silicon carbide occupies 10 to 80 wt % of said raw material, so as to obtain a mixture;

compacting said mixture to form thereof a compact body; and heating said compact body at a forging temperature not lower than the melting point Tm of said metal mainly consisting of aluminum or copper, and thereafter hot forging said compact body under a forging pressure of at least 1 ton/cm$^2$ while maintaining said forging temperature not lower than the melting point of said metal to form thereof a forged body.

15. The method of manufacturing a silicon carbide based composite material according to claim 14, wherein in said step of preparing said raw material, said powder has an oxygen content of at most 1 wt %, a content of a component containing iron, in iron element equivalent, of at most 0.01 wt %, and a content of a component containing aluminum, in aluminum element equivalent, of at most 0.01 wt %.

16. The method of manufacturing a silicon carbide based composite material according to claim 14, wherein in said step of preparing said raw material, said powder has an oxygen content of at most 0.1 wt %, a content of a component containing iron, in iron element equivalent, of at most 0.005 wt %, and a content of a component containing aluminum, in aluminum element equivalent, of at most 0.005 wt %.

17. The method of manufacturing a silicon carbide based composite material according to claim 14, wherein in said step of preparing said raw material, said silicon carbide has a 6H type crystal structure.

18. The method of manufacturing a silicon carbide based composite material according to claim 14, wherein said step of preparing said raw material includes a preliminary step of subjecting said powder to a preliminary heat treatment in which said powder is heated in an inert gas atmosphere at a temperature in a range of 1600° C. to 2400° C.

19. The method of manufacturing a silicon carbide based composite material according to claim 14, wherein said step of preparing said raw material includes a preliminary step of subjecting said powder to a preliminary acid treatment in which said powder is dipped in a solution containing at least one of hydrofluoric acid, nitric acid and hydrochloric acid.

20. The method of manufacturing a silicon carbide based composite material according to claim 14, wherein a heating time of said step of heating said compact body is at most 15 minutes.

21. The method of manufacturing a silicon carbide based composite material according to claim 14, wherein said heating of said compact body is electromagnetic induction heating or plasma induction heating.

22. The method of manufacturing a silicon carbide based composite material according to claim 14, further comprising, after said step of forging said compact body, a step of heat treatment in which said forged body is heated at a heat treatment temperature Th lower than said melting point Tm of said metal mainly consisting of aluminum and copper.

23. The method of manufacturing a silicon carbide based composite material according to claim 22, wherein said heat treatment temperature Th in said step of heat treatment satisfies the relation of Th>Tm−100.

24. A method of manufacturing a silicon carbide based composite material containing a metal mainly consisting of aluminum or copper and particles mainly consisting of silicon carbide, comprising the steps of:

preparing a raw material including metal mainly consisting of aluminum or copper and a powder mainly consisting of silicon carbide, including a preliminary step of subjecting said powder to a preliminary heat treatment in which said powder is heated in an inert gas atmosphere at a pretreatment temperature in a range from 1600° C. to 2400° C., wherein said powder has an oxygen content of at most 1 wt %, a content of a component containing iron, in iron element equivalent, of at most 0.01 wt %, and a content of a component containing aluminum, in aluminum element equivalent, of at most 0.01 wt %; and using said raw material, obtaining a silicon carbide based composite material containing 10 to 80 wt % of silicon carbide by one process selected from the group consisting of an infiltration process, a sintering process, a hot pressing process, and a casting process.

25. The method of manufacturing a silicon carbide based composite material according to claim 24, wherein in said step of preparing said raw material, said oxygen content is at most 0.1 wt %, said content of said component containing iron, in iron element equivalent, is at most 0.005 wt % and said content of said component containing aluminum, in aluminum element equivalent, is at most 0.005 wt %.

26. The method of manufacturing a silicon carbide based composite material according to claim 24, wherein in said step of preparing said raw material, said silicon carbide has 6H type crystal structure.

27. The method of manufacturing a silicon carbide based composite material according to claim 24, wherein said step of preparing said raw material further includes another preliminary step of subjecting said powder to a preliminary acid treatment in which said powder is dipped in a solution containing at least one of hydrofluoric acid, nitric acid and hydrochloric acid.

28. The method of manufacturing a silicon carbide based composite material according to claim 24, further comprising, after said step of obtaining said silicon carbide based composite material, a step of heat treatment in which said composite material is heated at a heat treatment temperature Th lower than a melting point Tm of said metal mainly consisting of aluminum or copper.

29. The method of manufacturing a silicon carbide based composite material according to claim 28, wherein said heat treatment temperature Th in said step of heat treatment satisfies the relation of Th>Tm−100.

30. A silicon carbide based composite material according to claim 1, having a thermal conductivity of at least 283 W/m·K.

* * * * *

UNITED STATES PATENT AND TRADEMARK OFFICE
CERTIFICATE OF CORRECTION

| | | |
|---|---|---|
| PATENT NO. | : 6,280,496 B1 | |
| DATED | : August 28, 2001 | |
| INVENTOR(S) | : Kawai et al. | |

It is certified that error appears in the above-identified patent and that said Letters Patent is hereby corrected as shown below:

<u>Title page,</u>
Item [56], References Cited, U.S. PATENT DOCUMENTS, insert the following:
-- 5,000,246   3/1991   Dwivedi et al. --;
FOREIGN PATENT DOCUMENTS,

| | | |
|---|---|---|
| 61-222668 | 10/1986 | (JP) |
| WO87/06624 | 11/1987 | (PCT) |
| 1-501489 | 05/1989 | (JP) |
| 2-243729 | 09/1990 | (JP) |
| WO92/17297 | 10/1992 | (PCT) |
| 08-279569 | 10/1996 | (JP) |
| 09-095,745 | 04/1997 | (JP) |
| 9-157773 | 06/1997 | (JP) |
| 0,798,393 | 10/1997 | (EP) |
| 0,813,243 | 12/1997 | (EP) |
| 0,859,410 | 08/1998 | (EP) |
| 10-280082 | 10/1998 | (JP) |
| 10-335538 | 12/1998 | (JP) |
| 11-28940 | 02/1999 | (JP) |

OTHER DOCUMENTS,
Chemical Abstracts, Vol. 127, No. 10, 8. September 1997, Abstract No. 138959
XP-002123711, Abstract of Japanese Patent 09-157773.

<u>Column 17,</u>
Line 51, after "pre-heat", replace "(reheating treatment)" by -- (preheating treatment) --;

<u>Column 32,</u>
Table 6, under the heading "raw material", replace the subheading "1$^{st}$ component" by -- second component --;

UNITED STATES PATENT AND TRADEMARK OFFICE
CERTIFICATE OF CORRECTION

PATENT NO. : 6,280,496 B1
DATED : August 28, 2001
INVENTOR(S) : Kawai et al.

It is certified that error appears in the above-identified patent and that said Letters Patent is hereby corrected as shown below:

Column 36,
Line 33, after "(where", replace "$20 \leq x \leq -80$)." by -- $20 \leq x \leq 80$). --.

Signed and Sealed this

Thirtieth Day of July, 2002

*Attest:*

*Attesting Officer*

JAMES E. ROGAN
*Director of the United States Patent and Trademark Office*